(12) United States Patent
Maekawa et al.

(10) Patent No.: US 10,083,924 B2
(45) Date of Patent: Sep. 25, 2018

(54) SEMICONDUCTOR DEVICE AND MANUFACTURING METHOD THEREOF

(71) Applicant: RENESAS ELECTRONICS CORPORATION, Koutou-ku, Tokyo (JP)

(72) Inventors: Kazuyoshi Maekawa, Tokyo (JP); Yuichi Kawano, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 23 days.

(21) Appl. No.: 14/891,319

(22) PCT Filed: Nov. 13, 2014

(86) PCT No.: PCT/JP2014/080072
§ 371 (c)(1),
(2) Date: Nov. 13, 2015

(87) PCT Pub. No.: WO2016/075791
PCT Pub. Date: May 19, 2016

(65) Prior Publication Data
US 2016/0379946 A1 Dec. 29, 2016

(51) Int. Cl.
*H01L 23/12* (2006.01)
*H01L 23/00* (2006.01)
(Continued)

(52) U.S. Cl.
CPC .......... *H01L 24/02* (2013.01); *H01L 21/3205* (2013.01); *H01L 21/768* (2013.01);
(Continued)

(58) Field of Classification Search
CPC ......... H01L 24/02; H01L 24/05; H01L 24/06; H01L 24/45; H01L 21/3205;
(Continued)

(56) References Cited

U.S. PATENT DOCUMENTS 5,969,424 A 10/1999 Matsuki et al.
6,455,408 B1 * 9/2002 Hwang ............... H01L 23/3114
257/E21.508

(Continued)

FOREIGN PATENT DOCUMENTS

JP 2000-306938 A 11/2000
JP 2003-37126 A 2/2003
(Continued)

OTHER PUBLICATIONS

Hiroshi et al. (JP2003037126 English translation).*
(Continued)

*Primary Examiner* — Jessica Manno
*Assistant Examiner* — Delma R Forde
(74) *Attorney, Agent, or Firm* — Shapiro, Gabor and Rosenberger, PLLC

(57) ABSTRACT

A semiconductor device includes: a pad electrode 9a formed in an uppermost layer of a plurality of wiring layers; a base insulating film 11 having an opening 11a on the pad electrode 9a; a base metal film UM formed on the base insulating film 11; a redistribution line RM formed on the base metal film UM; and a cap metal film CM formed so as to cover an upper surface and a side surface of the redistribution line RM. In addition, in a region outside the redistribution line RM, the base metal film UM made of a material different from that of the redistribution line RM and the cap metal film CM made of a material different from the redistribution line RM are formed between the cap metal film CM formed on the side surface of the redistribution line RM and the base insulating film 11, and the base metal film UM and the cap metal film CM are in direct contact with each other in the region outside the redistribution line RM.

15 Claims, 22 Drawing Sheets

(51) Int. Cl.
*H01L 21/3205* (2006.01)
*H01L 23/522* (2006.01)
*H01L 21/768* (2006.01)

(52) U.S. Cl.
CPC ............ *H01L 23/522* (2013.01); *H01L 24/05* (2013.01); *H01L 24/06* (2013.01); *H01L 24/45* (2013.01); *H01L 2224/024* (2013.01); *H01L 2224/0219* (2013.01); *H01L 2224/0235* (2013.01); *H01L 2224/0239* (2013.01); *H01L 2224/02166* (2013.01); *H01L 2224/02181* (2013.01); *H01L 2224/02185* (2013.01); *H01L 2224/02373* (2013.01); *H01L 2224/03462* (2013.01); *H01L 2224/03614* (2013.01); *H01L 2224/04042* (2013.01); *H01L 2224/05008* (2013.01); *H01L 2224/05025* (2013.01); *H01L 2224/05124* (2013.01); *H01L 2224/32225* (2013.01); *H01L 2224/4502* (2013.01); *H01L 2224/45144* (2013.01); *H01L 2224/45147* (2013.01); *H01L 2224/45565* (2013.01); *H01L 2224/45664* (2013.01); *H01L 2224/48095* (2013.01); *H01L 2224/48227* (2013.01); *H01L 2224/48228* (2013.01); *H01L 2224/48247* (2013.01); *H01L 2224/48465* (2013.01); *H01L 2224/73265* (2013.01); *H01L 2924/01022* (2013.01); *H01L 2924/01029* (2013.01); *H01L 2924/01046* (2013.01); *H01L 2924/04941* (2013.01); *H01L 2924/07025* (2013.01); *H01L 2924/15183* (2013.01); *H01L 2924/15311* (2013.01); *H01L 2924/181* (2013.01)

(58) Field of Classification Search
CPC ......... H01L 23/522; H01L 2224/02181; H01L 2224/02185; H01L 2224/0219; H01L 2224/0235; H01L 2224/02373; H01L 2224/0239; H01L 2224/024; H01L 2224/03462; H01L 2224/03614; H01L 2224/04042; H01L 2224/05008; H01L 2224/05025; H01L 2224/05124; H01L 2224/32225; H01L 2224/4502; H01L 2224/45144; H01L 2224/45147; H01L 2224/45565; H01L 2224/45664; H01L 2224/48095; H01L 2224/48227; H01L 2224/48228; H01L 2224/48247; H01L 2224/48465; H01L 2224/73265; H01L 2224/02331; H01L 2224/023; H01L 2224/02; H01L 2224/06147–2224/06149; H01L 2224/06167–2224/06169; H01L 2924/01022; H01L 2924/01029; H01L 2924/07025; H01L 2924/15183; H01L 2924/15311; H01L 2924/04941; H01L 2924/181; H01L 2924/01046
See application file for complete search history.

(56) References Cited

U.S. PATENT DOCUMENTS

| | | | | |
|---|---|---|---|---|
| 8,912,540 B2* | 12/2014 | Akiba | ................. | H01L 22/20 257/48 |
| 9,536,849 B2* | 1/2017 | Yajima | ................. | H01L 24/13 |
| 9,553,060 B2* | 1/2017 | Omori | ................. | H01L 21/76855 |
| 9,558,967 B2* | 1/2017 | Uchida | ................. | H01L 28/10 |
| 2003/0153172 A1 | 8/2003 | Yajima et al. | | |
| 2006/0103020 A1* | 5/2006 | Tong | ................. | H01L 23/3114 257/738 |
| 2006/0138671 A1* | 6/2006 | Watanabe | ........... | H01L 23/3114 257/773 |
| 2009/0206490 A1* | 8/2009 | Koide | ................. | H01L 23/3114 257/774 |
| 2010/0164105 A1 | 7/2010 | Onai et al. | | |
| 2011/0049705 A1* | 3/2011 | Liu | ................. | H01L 24/11 257/737 |
| 2011/0233761 A1* | 9/2011 | Hwang | ................. | H01L 24/03 257/737 |
| 2011/0298123 A1* | 12/2011 | Hwang | ................. | H01L 24/05 257/737 |
| 2011/0304049 A1 | 12/2011 | Shigihara et al. | | |
| 2012/0193787 A1 | 8/2012 | Maitani et al. | | |
| 2012/0208129 A1 | 8/2012 | Kuo et al. | | |
| 2012/0235278 A1 | 9/2012 | Shigihara et al. | | |
| 2014/0021618 A1* | 1/2014 | Shigihara | ........... | H01L 23/49811 257/762 |
| 2015/0206934 A1* | 7/2015 | Funaya | ............. | H01L 21/31144 438/3 |
| 2016/0064344 A1* | 3/2016 | Yajima | ................. | H01L 24/03 257/751 |
| 2016/0163666 A1* | 6/2016 | Yajima | ................. | H01L 24/08 257/773 |
| 2016/0181184 A1* | 6/2016 | Matsumoto | ........... | H01L 24/03 257/751 |
| 2017/0062292 A1* | 3/2017 | Yajima | ................. | H01L 22/32 |
| 2017/0062361 A1* | 3/2017 | Yajima | ................. | H01L 24/02 |

FOREIGN PATENT DOCUMENTS

| | | |
|---|---|---|
| JP | 2003-234348 A | 8/2003 |
| JP | 2006-005325 A | 1/2006 |
| JP | 2008-42038 A | 2/2008 |
| JP | 2010-56136 A | 3/2010 |
| JP | 2010-171386 A | 8/2010 |
| JP | 2012-4210 A | 1/2012 |
| JP | 2012-160512 A | 8/2012 |
| JP | 2012-191123 A | 10/2012 |

OTHER PUBLICATIONS

Masayoshi (JP2010056136, English translation).*
Tomoyuki et al. (JP2008042038, English translation).*
JP2006005325 (English translation) pp. 1-42 Aug. 14, 2018.*
Kanki, Tsuyoshi, et al.; "Development of highly reliable Cu wiring of L/S=1/1μm for chip to chip interconnection"; Interconnect Technology Conference; IEEE International; (2012).
International Search Report from International Patent Application No. PCT/JP2014/080072, dated Nov. 13, 2014.
Written Opinion of the International Searching Authority from PCT/JP2014/080072, dated Nov. 13, 2014.
Office Action dated Jan. 30, 2018, in Japanese Patent Application No. 2015-545230.
Extended European search report (including supplementary European search report and search opinion) from European Patent Application No. 14890461.8, dated Jun. 15, 2018.
Decision of Rejection dated Jul. 17, 2018, in Japanese Patent Application No. 2015-545230.

* cited by examiner

SEMICONDUCTOR DEVICE AND MANUFACTURING METHOD THEREOF

TECHNICAL FIELD

The present invention relates to a semiconductor device and a manufacturing method thereof, and particularly relates to a technique effectively applied to a semiconductor device having a redistribution line made of a metal film on a plurality of wiring layers formed on a main surface of a semiconductor substrate and a manufacturing method thereof.

BACKGROUND

In a semiconductor device, for example, a multilayer wiring made of a metal film containing Cu (copper) or Al (aluminum) as a main component is formed on a semiconductor substrate on which a semiconductor element such as a CMIS (Complementary Metal Insulator Semiconductor) transistor is formed, and a final passivation film is formed on the multilayer wiring.

Japanese Patent Application Laid-Open Publication No. 2003-234348 (Patent Document 1) discloses a technique in which a redistribution line containing Cu as a main component is formed on a final passivation film and an electrode pad formed in an uppermost layer wiring below the passivation film is electrically connected to the redistribution line.

FIG. 25 of Japanese Patent Application Laid-Open Publication No. 2012-4210 (Patent Document 2) discloses a structure in which a wire 20 is connected to a pad 18 formed so as to partially cover an upper surface and a side surface of a redistribution line 15 containing Cu as a main component.

The abstract of Japanese Patent Application Laid-Open Publication No. 2000-306938 (Patent Document 3) discloses that a redistribution layer 6 made of aluminum alloy formed on a passivation film 4 is completely covered with a barrier metal film 8 having a projecting part 9 that projects on the passivation film 4, thereby suppressing the occurrence of migration and corrosion of the redistribution layer 6.

"Development of highly reliable Cu wiring of L/S=1/1 for chip to chip interconnection" (Non-Patent Document 1) discloses a structure in which a metal barrier film formed by electroless plating is provided on an upper surface and a side surface of a Cu wiring formed by SAP (Semi-Additive Process) in order to improve the reliability of the Cu wiring.

PRIOR ART DOCUMENTS

Patent Documents

Patent Document 1: Japanese Patent Application Laid-Open Publication No. 2003-234348
Patent Document 2: Japanese Patent Application Laid-Open Publication No. 2012-4210
Patent Document 3: Japanese Patent Application Laid-Open Publication No. 2000-306938

Non-Patent Documents

Non-Patent Document 1: T. Kanki et al., "Development of highly reliable Cu wiring of L/S=1/1 μm for chip to chip interconnection" Interconnect Technology Conference, 2012 IEEE International, 4-6 Jun. 2012

SUMMARY

Problems to be Solved by the Invention

A semiconductor device (semiconductor integrated circuit device) having a redistribution line examined by the inventors of the present application includes: a semiconductor chip; a wire connected to the semiconductor chip; and a sealing member in which the semiconductor chip and the wire are sealed. The semiconductor chip has a semiconductor element, a redistribution line electrically connected to the semiconductor element and containing Cu as a main component, and a wiring made of a multilayer wiring layer which electrically connects the semiconductor element and the redistribution line. The redistribution line is connected to a pad electrode which is a part of the wiring formed of an uppermost wiring layer of the multilayer wiring layer. The wiring formed of the uppermost wiring layer and the redistribution line are electrically separated by a surface protection film which covers the wiring formed of the uppermost wiring layer and a first organic protection film formed on the surface protection film, but the redistribution line is electrically connected to the pad electrode through an opening of the surface protection film and the first organic protection film provided so as to expose the pad electrode. An upper surface and a side surface of the redistribution line are covered with a second organic protection film, but the second organic protection film has an opening which exposes an external pad electrode formed on the upper surface of the redistribution line, and the wire is connected to the redistribution line through the opening.

In the semiconductor chip, a plurality of redistribution lines are formed, and a minimum line width of the redistribution lines is 12 μm and a minimum interval between adjacent redistribution lines is 15 μm. A seed layer made of a metal film (for example, Cr film) for forming the redistribution line is provided on a lower surface of the redistribution line and the upper surface and the side surface of the redistribution line are in contact with the second organic protection film.

Since the semiconductor device examined by the inventors of the present application is required to have high withstand voltage and high reliability, an operation test in a high-temperature and high-humidity atmosphere referred to as HAST (Highly Accelerated temperature and humidity Stress Test) is carried out. According to the examination by the inventors of the present application, it has been found in the HAST that Cu is precipitated in a dendritic form from one of adjacent redistribution lines and the deterioration in the withstand voltage or the short circuit between the adjacent redistribution lines occurs, so that the reliability of the semiconductor device is degraded. In addition, it has also been found that the precipitation of Cu in the dendritic form occurs at an interface between the surface protection film and the first organic protection film or between the first and second organic protection films.

According to the analysis by the inventors of the present application, since the first and second organic protection films which cover the redistribution line made of Cu are made of a polyimide film and contain water and halogen ions, the surface of Cu constituting the redistribution line is oxidized, and as a result, Cu ions (ionized Cu) are generated. It has been found that, in the semiconductor device mentioned above, although the minimum interval (15 μm) between the adjacent redistribution lines is large, there is a region in which high voltage is applied and a high electric field is applied between the adjacent redistribution lines, and the precipitation of Cu in the dendritic form occurs in this region. Specifically, Cu ions move (diffuse) in the interface between the surface protection film and the first organic protection film or the interface between the first and second organic protection films due to the influence of the high electric field, so that the deterioration in the withstand voltage or the short circuit between the adjacent redistribution lines occurs and the reliability of the semiconductor device is degraded.

An object of the present invention is to provide a technique capable of improving the reliability in a semiconductor device having a redistribution line.

The above and other objects and novel characteristics of the present invention will be apparent from the descriptions of the present specification and appended drawings.

Means for Solving the Problems

A semiconductor device of an embodiment includes: a pad electrode formed in an uppermost layer of a plurality of wiring layers; a protection film having an opening on the pad electrode; a base metal film formed on the protection film; a redistribution line formed on the base metal film; and a cap metal film formed so as to cover an upper surface and a side surface of the redistribution line. In addition, the base metal film made of a material different from that of the redistribution line and the cap metal film made of a material different from that of the redistribution line are formed between the cap metal film formed on the side surface of the redistribution line and the protection film in a region outside the redistribution line, and the base metal film and the cap metal film are in direct contact with each other in the region outside the redistribution line.

Effects of the Invention

According to an embodiment, it is possible to improve the reliability of a semiconductor device having a redistribution line.

DETAILED DESCRIPTION

Figure 1:
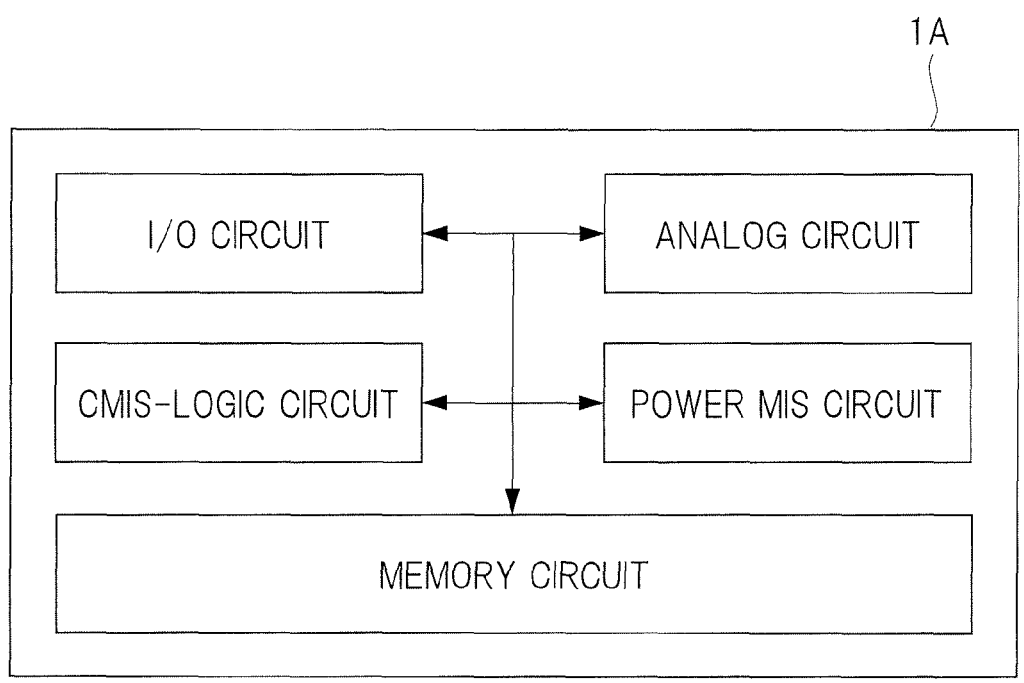
FIG. 1 is a circuit block diagram of a semiconductor device of the first embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical values described above (including number of pieces, values, amount, range, and the like).

Hereinafter, embodiments of the present invention will be described in detail with reference to the accompanying drawings. Note that components having the same function are denoted by the same reference characters throughout the drawings for describing the embodiments, and the repetitive description thereof will be omitted. In addition, when there are a plurality of similar members (portions), an individual or specific portion is indicated by adding a symbol to a generic character in some cases. Also, the description of the same or similar portions is not repeated in principle unless particularly required in the following embodiments.

In some drawings used in the following embodiments, hatching is sometimes omitted even in a sectional view so as to make the drawings easy to see. Also, hatching is sometimes used even in a plan view so as to make the drawings easy to see.

Further, the size of respective portions does not correspond to that of an actual device in sectional views and plan views, and a specific portion is shown in a relatively enlarged manner in some cases so as to make the drawings easy to see. In addition, even when a plan view and a cross-sectional view correspond to each other, the portion may be illustrated in different sizes in some cases.

First Embodiment

The semiconductor device (semiconductor integrated circuit device) of the first and subsequent embodiments includes a semiconductor chip having a plurality of semiconductor elements, wirings in a plurality of layers (multilayer wirings) formed on the plurality of semiconductor elements and a plurality of redistribution lines connected to the wiring in the uppermost layer among the plurality of layers, and the plurality of semiconductor elements are connected by the multilayer wirings and the plurality of redistribution lines.

<Semiconductor Device>

FIG. 1 is a circuit block diagram of a semiconductor device. As shown in FIG. 1, the semiconductor device is provided with, for example, an input/output (I/O) circuit, an analog circuit, a CMIS-logic circuit, a power MIS circuit and a memory circuit formed on a device surface of a semiconductor chip 1A.

The CMIS-logic circuit among the above-mentioned circuits constituting the semiconductor device is constituted of, for example, a CMIS transistor with an operating voltage of 1 to 3 V, and the I/O circuit and the memory circuit are constituted of, for example, CMIS transistors with an operating voltage of 1 to 3 V and 5 to 8 V.

The CMIS transistor with an operating voltage of 1 to 3 V is constituted of a first n channel MISFET (Metal Insulator Semiconductor Field Effect Transistor) having a first gate insulating film and a first p channel MISFET having a first gate insulating film. In addition, a CMIS transistor with an operating voltage of 5 to 8 V is constituted of a second n channel MISFET having a second gate insulating film and a second p channel MISFET having a second gate insulating film. The second gate insulating film is formed to have a thickness larger than that of the first gate insulating film. In the following descriptions, the MISFET is referred to as a MIS transistor.

Further, the analog circuit is constituted of, for example, a CMIS transistor (or bipolar transistor) with an operating voltage of 5 to 8 V, a resistor element and a capacitor element, and the power MIS circuit is constituted of, for example, a CMIS transistor with an operating voltage of 5 to 8 V and a high withstand voltage MIS transistor (high withstand voltage element) with an operating voltage of 20 to 100 V.

The high withstand voltage MIS transistor is constituted of, for example, a third n channel MISFET having a third gate insulating film, a third p channel MISFET having a third gate insulating film or both of them. In the case where a voltage of 20 to 100 V is applied between a gate electrode and a drain region or between a gate electrode and a source region, the third gate insulating is formed to have a thickness larger than that of the second gate insulating film.

Figure 2:
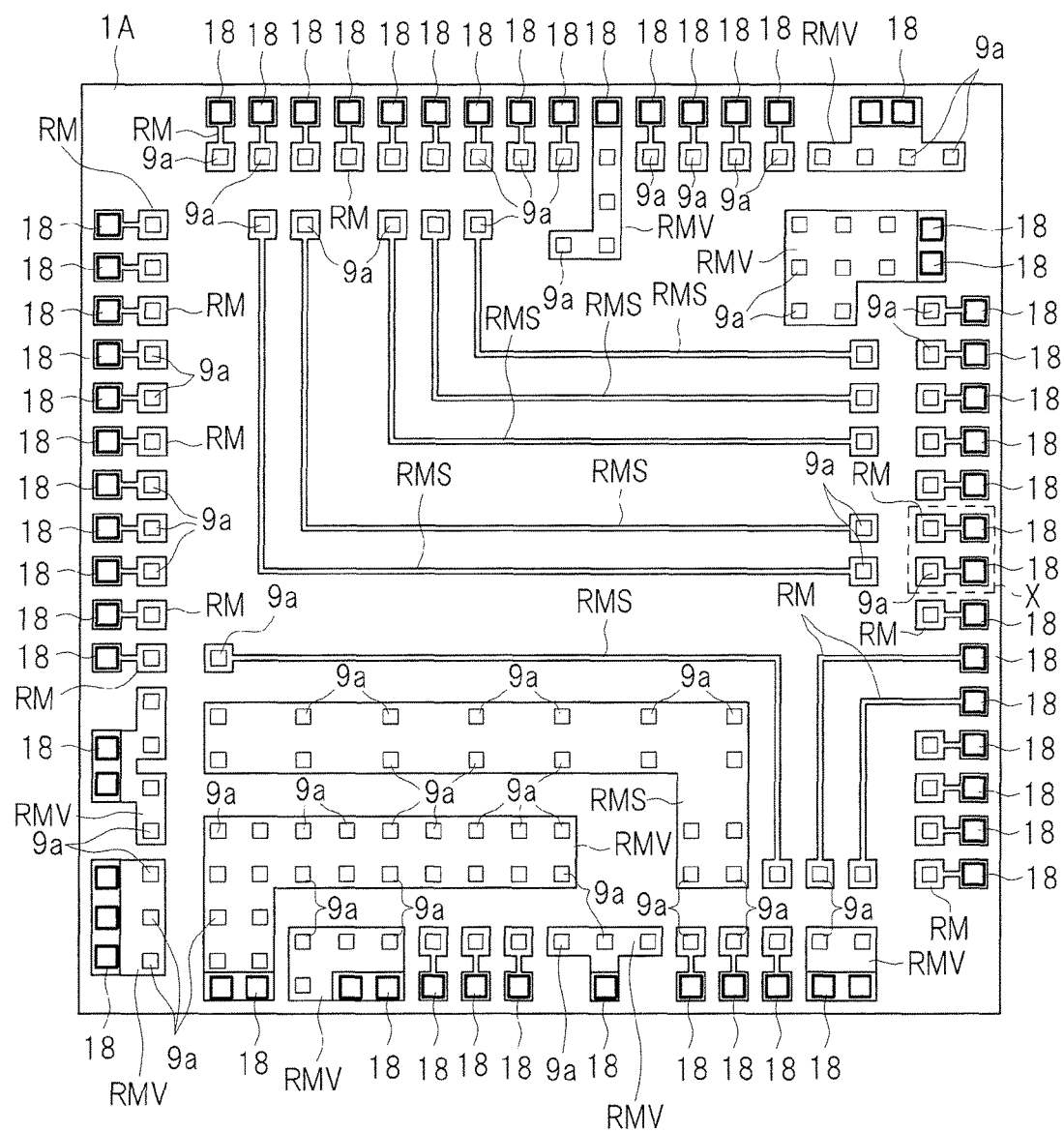
FIG. 2 is an overall plan view of a semiconductor chip on which the semiconductor device of the first embodiment of the present invention is formed.
Figure 3:
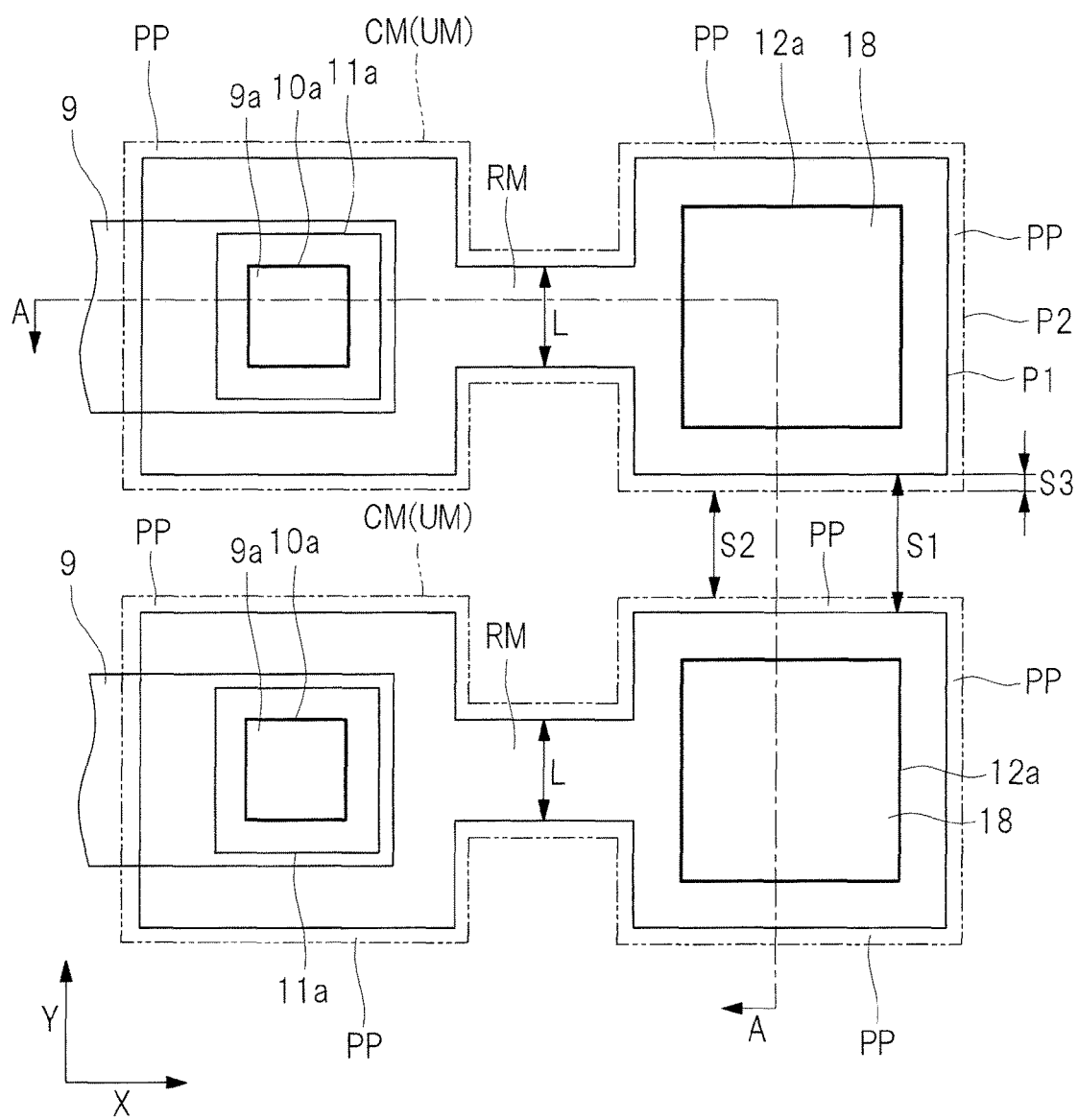
FIG. 3 is a plan view showing a part of FIG. 2 in an enlarged manner.
Figure 4:
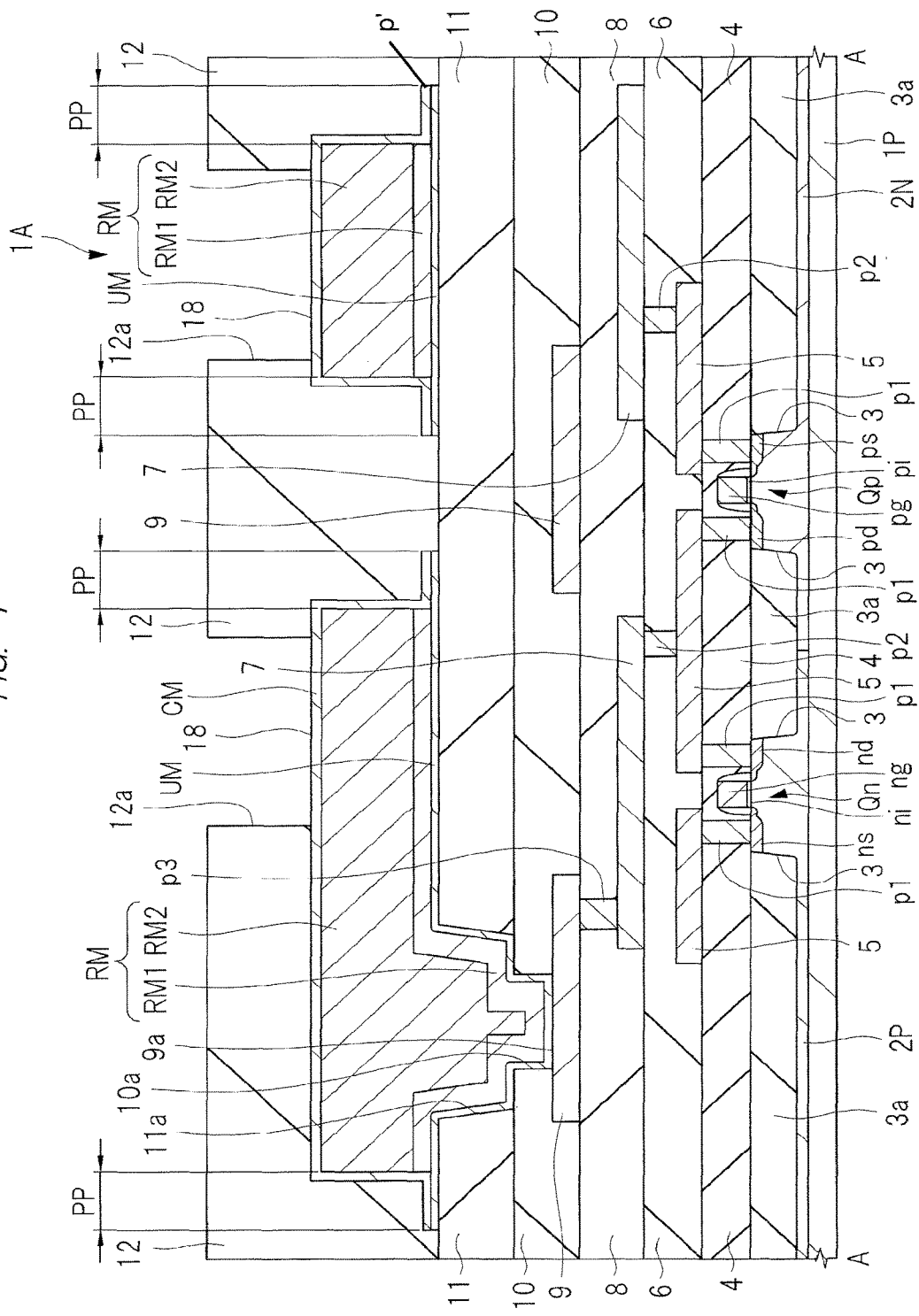
FIG. 4 is a cross-sectional view taken along the line A-A in FIG. 3.

FIG. 2 is an overall plan view showing an example of the semiconductor chip 1A, FIG. 3 is an enlarged plan view of a region surrounded by a broken line X in FIG. 2, and FIG. 4 is a cross-sectional view taken along the line A-A in FIG. 3.

FIG. 2 shows an example of the layout of the redistribution lines RM, RMV and RMS formed on the device surface of the semiconductor chip 1A. The redistribution lines RM, RMV and RMS have a thickness and a line width larger than those of the wirings in a plurality of layers (first layer Al wiring 5, second layer Al wiring 7 and third layer Al wiring 9 shown in FIG. 4) of the semiconductor chip 1A, and thus have much lower impedance in comparison with the wirings in the plurality of layers. The redistribution lines RM, RMV and RMS are used as, for example, the redistribution line RM for inputting and outputting signals, the redistribution line RMV for power source (Vcc, GND) and the redistribution line RMS for connection between internal circuits, respectively.

As shown in FIG. 2, a plurality of redistribution lines RM constituting the external connection terminals of the semiconductor device are arranged in a peripheral part of the semiconductor chip 1A. An external pad electrode 18 is formed at one end of each of the redistribution lines RM constituting the external connection terminals of the semiconductor device, and the other end thereof is connected to a pad electrode 9a formed in the wiring of the uppermost layer as shown in FIGS. 3 and 4. Though not particularly limited, the external pad electrodes 18 are arranged in a row along each of the sides of the semiconductor chip 1A. It is needless to say that the external pad electrodes 18 may be arranged in a zigzag manner or in three or more rows along each of the sides of the semiconductor chip 1A. In short, the redistribution lines RM function as, for example, redistribution lines for inputting and outputting signals constituting the input/output (I/O) circuit of FIG. 1.

Also, the redistribution line RMV shown in FIG. 2 functions as a redistribution line for power source (Vcc, GND). Since the external pad electrode 18 is formed at one end of the redistribution line RMV and the other end thereof is connected to the pad electrode 9a formed in the power source wiring in the semiconductor chip 1A, the power source (Vcc, GND) voltage supplied from the outside of the semiconductor chip 1A can be supplied to the plurality of power source wirings in the semiconductor chip 1A at low impedance.

In addition, the redistribution line RMS shown in FIG. 2 is used as the wiring to connect the circuits or the elements formed in the semiconductor ship 1A. Therefore, the redistribution line RMS does not have the external pad electrode 18. Both ends of the redistribution line RMS are connected to the pad electrodes 9a formed in the wiring.

FIG. 3 shows an enlarged plan view of the two adjacent redistribution lines RM for inputting and outputting signals. Since the two adjacent redistribution lines RM have the same planar shape, the redistribution line RM located in an upper part of FIG. 3 will be described as an example. The redistribution line RM extends in an X direction of FIG. 3 and is electrically connected at one end thereof to the pad electrode 9a of the wiring 9 extending in the X direction. The external pad electrode 18 is formed at the other end of the redistribution line RM. The redistribution line RM has a first planar pattern P1 and a base metal film UM and a cap metal film CM have a second planar pattern P2. The first planar pattern P1 and the second planar pattern P2 are similar, and the second planar pattern P2 has a shape obtained by enlarging the first planar pattern P1. A projecting part PP constituted of the base metal film UM and the cap metal film CM is disposed in the entire circumference of the redistribution line RM. Specifically, when the first planar pattern P1 is enlarged by a width S3 of the projecting part PP, the second planar pattern P2 is obtained.

In addition, the minimum line width L of the redistribution line RM is, for example, 12 µm, the minimum wiring interval S1 between the adjacent redistribution lines RM is 15 µm, the minimum interval S2 between the adjacent projecting parts PP is 10 µm, and the projecting amount S3 of the projecting part PP is 2.5 µm.

Ideally, the projecting amount S3 of the projection part PP is equal over the entire circumference of the redistribution line RM. However, it is also acceptable that the second planar patter P2 is misaligned with the first planar pattern P1 by, for example, α in the X direction. In the case where the second planar pattern P2 is misaligned with the first planar pattern P1 by only α in the X direction, the projecting amount on the right side of the first planar pattern P1 becomes S3R=(S3+α) and the projecting amount on the left side becomes S3L=(S3−α).

In the first embodiment, the projecting amount S3 is sufficiently secured so that the projecting amount S3L=(S3−α) on the reduced side is larger than the thickness of the cap metal film CM formed on a side surface of the redistribution line RM shown in FIG. 4.

As shown in FIG. 4, a p type well 2P, an n type well 2N and an element isolation trench 3 are formed in a semiconductor substrate 1P made of, for example, a p type monocrystalline silicon, and an element isolation insulating film 3a made of, for example, a silicon oxide film is buried in the element isolation trench 3.

An n channel MIS transistor (Qn) is formed in the p type well 2. The n channel MIS transistor (Qn) is formed in an active region defined by the element isolation trench 3, and has a source region ns and a drain region nd formed in the p type well 2P and a gate electrode ng formed on the p type well 2P via a gate insulating film ni. In addition, a p channel MIS transistor (Qp) is formed in the n type well 2N, and has a source region ps and a drain region pd and a gate electrode pg formed on the n type well 2N via a gate insulating film pi.

On the n channel MIS transistor (Qn) and the p channel MIS transistor (Qp), wirings which are made of metal films and connect the semiconductor elements to each other are formed. The wiring to connect the semiconductor elements to each other generally has a multilayer wiring structure in three to ten layers, and FIG. 4 shows the wiring structure in three layers (first layer Al wiring 5, second layer Al wiring 7 and third layer Al wiring 9) constituted of metal films containing Al alloy as a main component as an example of the multilayer wiring. The "wiring layer" is used when collectively describing a plurality of wirings formed in each of the wiring layers. With respect to the thickness of the wiring layers, the wiring layer in the second layer is thicker than the wiring layer in the first layer and the wiring layer in the third layer is thicker than the wiring layer in the second layer.

Between the n channel MIS transistor (Qn) and p channel MIS transistor (Qp) and the first layer Al wiring 5, between the first layer Al wiring 5 and the second layer Al wiring 7 and between the second layer Al wiring 7 and the third layer Al wiring 9, interlayer insulating films 4, 6 and 8 made of silicon oxide films and plugs p1, p2 and p3 which electrically connect the wirings in the three layers are formed.

The interlayer insulating film 4 is formed on the semiconductor substrate P1 so as to cover the semiconductor elements and the first layer Al wiring 5 is formed on the interlayer insulating film 4. The first layer Al wiring 5 is electrically connected to the source region ns, the drain region nd and the gate electrode ng of the n channel MIS transistor (Qn) serving as a semiconductor element through the plug p1 formed in the interlayer insulating film 4. In addition, the first layer Al wiring 5 is electrically connected to the source region ps, the drain region pd and the gate electrode pg of the p channel MIS transistor (Qp) serving as a semiconductor element through the plug p1 formed in the interlayer insulating film 4. Connections between the gate electrodes ng and pg and the first layer Al wiring 5 are not illustrated.

The second Al wiring 7 is electrically connected to the first layer Al wiring 5 through the plug p2 formed in the interlayer insulating film 6. The third layer Al wiring 9 is electrically connected to the second layer Al wiring 7 through the plug p3 formed in the interlayer insulating film 8. The plugs p1, p2 and p3 are made of metal films, for example, W (tungsten) films.

When the multilayer wiring (three-layer wiring) is formed of metal films containing Cu as a main component by using the chemical mechanical polishing method (CMP method), it is of course possible to form the wiring and the plug integrally by the dual damascene method. In addition, the interlayer insulating films 4, 6 and 8 are made of silicon oxide films ($SiO_2$), but it is needless to say that the interlayer insulating films 4, 6 and 8 can be constituted of a single layer film or a laminated film of a silicon oxide film containing carbon (SiOC film), a silicon oxide film containing nitrogen and carbon (SiCON film) and a silicon oxide film containing fluorine (SiOF film).

On the third layer Al wiring 9 which is the uppermost wiring layer of the multi layer wiring, a surface protection film (protection film, insulating film) 10 constituted of a single layer film of a silicon oxide film or a silicon nitride film or a two-layer film of these films is formed as a final passivation film. Then, the third layer Al wiring 9 which is the uppermost wiring layer exposed at the bottom of a pad opening (opening) 10a formed in the surface protection film 10 constitutes the pad electrode (electrode pad, first electrode pad) 9a serving as an Al pad.

The third layer Al wiring 9 constitutes not only the pad electrode 9a but the wiring integrally formed with the pad electrode 9a, the wiring not connected to the pad electrode 9a and others. The wiring not connected to the pad electrode 9a electrically connects the semiconductor elements or the circuits to each other, and is used as the wiring constituting the semiconductor integrated circuit.

A base insulating film (organic protection film, insulating film) 11 which is an insulating film having an opening 11a above the pad opening 10a is formed on the surface protection film 10. Furthermore, the redistribution line RM electrically connected to the pad electrode 9a through the opening 11a of the base insulating film 11 and the pad opening 10a of the surface protection film 10 is formed on the base insulating film 11. The opening 11a is larger than the pad opening 10a, and the upper surface (front surface) of the surface protection film 10 which defines the pad opening 10a on the entire circumference of the pad opening 10a is exposed from the opening 11a. The redistribution line RM is formed inside the pad opening 10a and the opening 11a so as to completely fill the pad opening 10a and the opening 11a, and extends on the base insulating film 11.

The base metal film UM is interposed between the pad electrode 9a and the redistribution line RM. The base metal film UM is in contact with and electrically connected to the pad electrode 9a, is formed on the side surface (side wall) and the upper surface of the surface protection film 10 and the side surface (side wall) of the base insulating film 11 in the pad opening 10a of the surface protection film 10 and the opening 11a of the base insulating film 11, and extends on the upper surface of the base insulating film 11. The base metal film UM has an upper surface and a lower surface, the upper surface is in contact with the redistribution line RM and the lower surface is in contact with the pad electrode 9a, the surface protection film 10 and the base insulating film 11. As described later, the base metal film UM is constituted of a base barrier film with a three-layer structure and is made up of a first base barrier film UM1, a second base barrier film UM2 and a third base barrier film UM3 formed from the side of the pad electrode 9a. Therefore, the upper surface of the base metal film UM means the upper surface of the third base barrier film UM3 and the lower surface of the base metal film UM means the lower surface of the first base barrier film UM1. The first base barrier film UM1, the second base barrier film UM2 and the third base barrier film UM3 are constituted of, for example, a titanium (Ti) film, a titanium nitride (TiN) film and a titanium (Ti) film, respectively, and the thicknesses thereof are 10 nm, 50 nm and 10 nm, respectively. These thicknesses are thicknesses on the upper surface of the base insulating film 11.

In addition, the redistribution line RM has an upper surface, a lower surface and a side surface and the lower surface of the redistribution line RM is in contact with the upper surface of the base metal film UM. The redistribution line RM is a copper film containing copper (Cu) as a main component and is constituted to have a laminated structure of a seed film RM1 and a plating film RM2. Therefore, the lower surface of the redistribution line RM means the lower surface of the seed film RM1 and the upper surface of the redistribution line RM means the upper surface of the plating film RM2. Also, the side surface (side wall) of the redistribution line RM means the side surface (side wall) of the laminated structure of the seed film RM1 and the plating film RM2. The thicknesses of the seed film RM1 and the plating film RM2 are 250 nm and 6 μm, respectively. Incidentally, since the thickness of the third layer Al wiring 9 is 400 to 600 nm, the redistribution line RM is a low-resistance wiring having a thickness ten or more times larger than the third layer Al wiring 9, in other words, the wiring 9 in which the pad electrode 9a is formed. Namely, the thickness of the redistribution line RM is larger than the thickness of the wiring 9 in which the pad electrode 9a is formed. Desirably, the thickness of the redistribution line RM is ten or more times larger than the thickness of the wiring 9 in which the pad electrode 9a is formed.

The cap metal film CM is formed so as to be in contact with the upper surface and the side surface of the redistribution line RM and completely cover the redistribution line RM. The cap metal film CM covers the entire upper surface and the entire side surface of the redistribution line RM. The cap metal film CM completely covers the side surface (side wall) of the seed film RM1 and the side surface (side wall) of the plating film RM2 constituting the redistribution line RM. The cap metal film CM has an upper surface and a lower surface, and the lower surface is in contact with the upper surface of the redistribution line RM and the side surface of the redistribution line RM and, as described below, is in direct contact with the upper surface of the base metal film UM in a region outside the redistribution line RM (region in which the redistribution line RM is not formed).

As shown in FIG. 4, the base metal film UM and the cap metal film CM have the projecting part PP from the side surface of the redistribution line RM (strictly, lower end part of the side surface of the redistribution line RM) to the region outside the redistribution line RM (region in which the redistribution line RM is not formed). The projecting part has a projecting portion p' disposed outside of the cap metal film formed on the side surface of the redistribution line, and the base metal film and the cap metal film are in contact with each other in the projecting portion. In addition, the projecting amount S3 of the projecting part PP is larger than the thickness of the cap metal film CM formed on the side surface (side wall) of the redistribution line RM, and is, for example, 2.5 μm. Namely, when seen in a plan view, the ends of the base metal film UM and the cap metal film CM corresponding to the edge of the projecting part PP are located on an outer side of the redistribution line RM than the cap metal film CM formed on the side surface (side wall) of the redistribution line RM. In addition, the projecting part PP is formed in the entire circumference of the redistribution line RM when seen in a plan view. The projecting amount S3 is a width of the projecting part PP and it means the distance from the end of the redistribution line RM to the end of the base metal film UM or the cap metal film CM in the region outside the redistribution line RM.

As described later, the cap metal film CM has a laminated structure of a first cap barrier film CM1 and a second cap barrier film CM2, and the lower surface of the first cap barrier film CM1 is in contact with the upper surface and the side surface of the redistribution line RM and is further in contact with the upper surface of the base metal film UM (correctly, upper surface of the third base barrier film UM3). The lower surface of the cap metal film CM means the lower surface of the first cap barrier film CM1 and the upper surface thereof means the upper surface of the second cap barrier film CM2. The first cap barrier film CM1 is made of a titanium (Ti) film and the thickness thereof is 50 nm. The second cap barrier film CM2 is made of a palladium (Pd) film and the thickness thereof is 175 nm. These thicknesses are thicknesses on the upper surface of the redistribution line RM.

In addition, since films made of the same material (specifically, titanium (Ti) films) are used as the third base barrier film UM3 constituting the base metal film UM and the first cap barrier film CM1 constituting the cap metal film CM, the adhesiveness between the base metal film UM and the cap metal film CM in the projecting part PP can be made strong, and the movement (diffusion) of copper constituting the redistribution line RM can be reduced.

Furthermore, since the projecting part PP has the structure in which the cap metal film CM is stacked on the base metal film UM, the sum of the thickness of the base metal film UM and the thickness of the cap metal film CM in the projecting part PP in the region outside the redistribution line RM is larger than the thickness of the base metal film UM sandwiched between the redistribution line PM and the base insulating film 11. Also, the sum of the thickness of the base metal film UM and the thickness of the first cap barrier film CM1 in the projecting part PP in the region outside the redistribution line RM is larger than the thickness of the base metal film UM sandwiched between the redistribution line RM and the base insulating film 11.

A protection film 12 is formed so as to totally cover the redistribution line RM. The protection film 12 has an opening 12a which partly exposes the upper surface of the redistribution line RM (correctly, upper surface of the cap metal film CM, upper surface of the second cap barrier film CM2), and the exposed part of the redistribution line RM serves as the external pad electrode 18.

Here, as the base insulating film 11 and the protection film 12, organic films, for example, films made of polyimide-based resin, benzocyclobutene-based resin, acrylic-based resin, epoxy-based resin and silicone-based resin can be used.

Note that the base metal film UM and the cap metal film CM are provided for preventing the copper (Cu) film constituting the redistribution line RM from being copper ions and moving (diffusing) to the outside, and they are made of a material different from that of the redistribution line RM (different materials). In addition, the base metal film UM and the cap metal film CM do not contain a copper (Cu) film.

In the foregoing description, the redistribution line RM for inputting and outputting signals is taken as an example, but the redistribution line RMV for power source and the redistribution line RMS for connection between internal circuits or between elements also have the same structure as the redistribution line RM.

<Characteristics of Semiconductor Device>

Hereinafter, main characteristics of the semiconductor device of the first embodiment will be described.

The redistribution line RM made of a copper film is completely surrounded by the base metal film UM which covers the lower surface of the redistribution line RM and is made of a material different from the redistribution line RM and the cap metal film CM which covers the upper surface and the side surface of the redistribution line RM and is made of a material different from the redistribution line RM. Then, in the region outside the redistribution line RM, the base metal film UM and the cap metal film CM have the projecting part PP, and the base metal film UM and the cap metal film CM are in direct contact with each other in the projecting part PP. With this structure, even when an electric field is applied between adjacent redistribution lines RM, the deterioration in the withstand voltage or the short circuit between the adjacent redistribution lines RM, which occurs due to the movement (diffusion) of copper constituting the redistribution line RM to the region outside the redistribution line RM, can be prevented. In addition, since it is possible to prevent the penetration of water, halogen ions and others contained in the polyimide film constituting the base insulating film 11 or the protection film 12 into the redistribution line PM made of a copper film, the oxidation of the copper film can be prevented and the deterioration in the withstand voltage or the short circuit between the adjacent redistribution lines RM can be prevented.

The projecting amount of the projecting part is larger than the thickness of the cap metal film CM covering the side surface of the redistribution line RM. Also, even when the projecting amount is reduced due to the misalignment of the second pattern with respect to the first pattern, since the reduced projecting amount is larger than the thickness of the cap metal film CM covering the side surface of the redistribution line RM, the deterioration in the withstand voltage or the short circuit between the adjacent redistribution lines RM can be prevented even if there are manufacturing variations. The oxidation of the copper film constituting the redistribution line RM can also be prevented.

In addition, films made of the same material are used as the base barrier film serving as the upper surface of the base metal film UM and the cap barrier film serving as the lower surface of the cap metal film. Therefore, since the adhesiveness between the base metal film UM and the cap metal film CM in the projecting part can be improved and the movement (diffusion) of copper constituting the redistribution line RM to the region outside the redistribution line RM can be sufficiently prevented, the deterioration in the withstand voltage or the short circuit between the adjacent redistribution lines RM and the oxidation of the redistribution line RM can be prevented.

Also, since the projecting part PP is formed in the entire circumference of the redistribution line RM when seen in a plan view, the deterioration in the withstand voltage or the short circuit between the redistribution lines RM adjacent in all directions and the oxidation of the redistribution line can be prevented.

The redistribution line RM is completely enclosed by the base metal film UM and the cap metal film CM having the second planar pattern P2 larger than the first planar pattern P1 of the redistribution line RM made of a copper film when seen in a plan view, and the upper surface of the base metal film UM and the lower surface of the cap metal film CM are in direct contact with each other in the region outside the redistribution line RM. With this structure, even when a high electric field is applied between adjacent redistribution lines RM, the oxidation of the redistribution line RM can be prevented, and the deterioration in the withstand voltage or the short circuit between the adjacent redistribution lines RM can be prevented. In addition, even when the copper film constituting the redistribution line RM is oxidized to generate copper ions, it is possible to prevent the movement (diffusion) of the copper ions to the outside of the redistribution line RM.

In addition, since the second planar pattern P2 is larger than the first planar pattern P1 in the entire circumference of the first planar pattern P1, the deterioration in the withstand voltage or the short circuit between the redistribution lines RM adjacent in all directions can be prevented.

<Manufacturing Method of Semiconductor Device>

Next, the manufacturing method of the semiconductor device of the first embodiment will be described. In the following description, the manufacturing method of the redistribution line serving as a characteristic of the first embodiment will be mainly described. The manufacturing method of the redistribution line corresponds to the cross section shown in FIG. 4.

FIGS. 5 to 13 are cross-sectional views showing the manufacturing process of the semiconductor device of the first embodiment.

Figure 5:
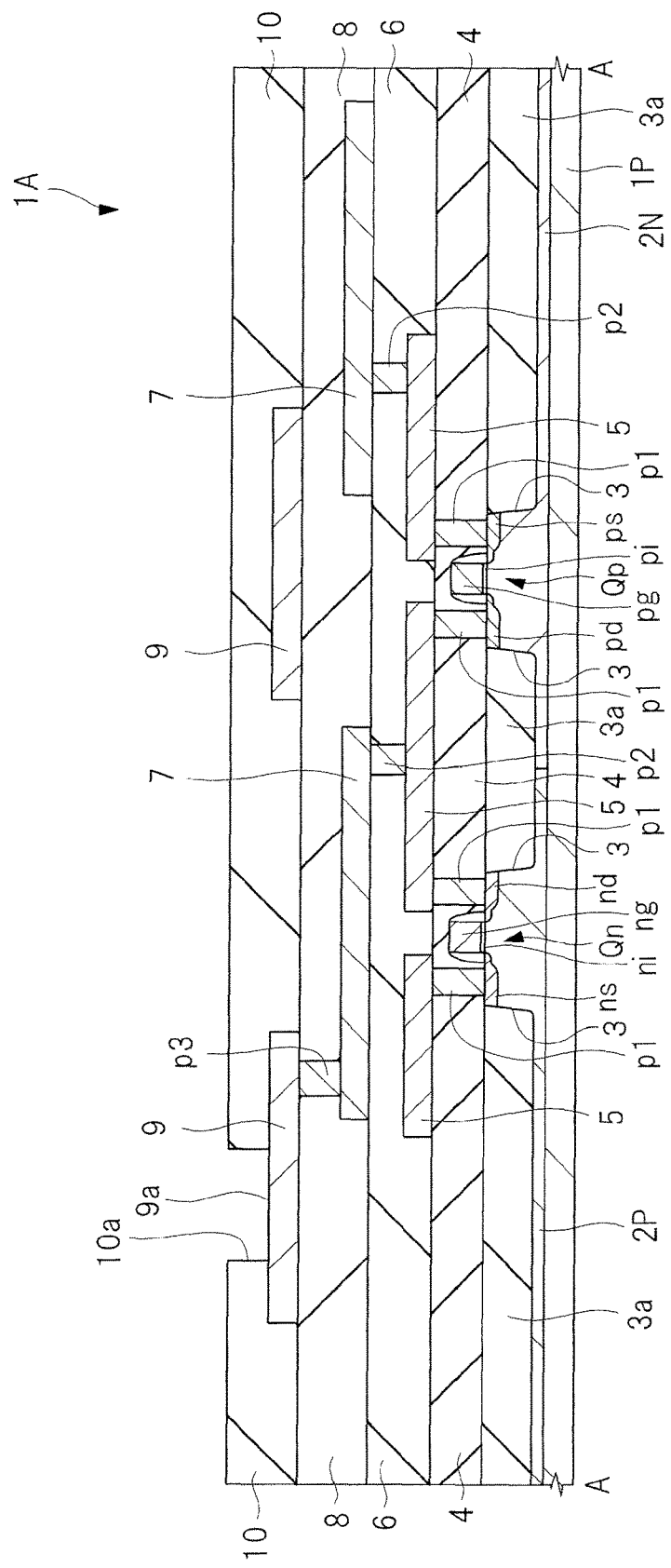
FIG. 5 is a cross-sectional view showing a manufacturing process of the semiconductor device of the first embodiment.

FIG. 5 shows a process of preparing a semiconductor substrate on which a plurality of wiring layers and pad electrodes are formed. On the semiconductor substrate 1P, the p channel MIS transistor (Qp) and the n channel MIS transistor (Qn) are formed, and the wirings made up of a plurality of wiring layers are then formed. Specifically, as described with reference to FIG. 4, wiring layers (first layer Al wiring 5, second layer Al wiring 7 and third layer Al wiring 9) are formed in three layers. Then, the surface protection film 10 is formed on the third layer Al wiring 9. The surface protection film 10 has the pad opening 10a, and a part of the third layer Al wiring 9 in the uppermost wiring layer exposed from the pad opening 10a serves as the pad electrode 9a. The cross-sectional structure shown in FIG. 5 is as described above with reference to FIG. 4.

Figure 6:
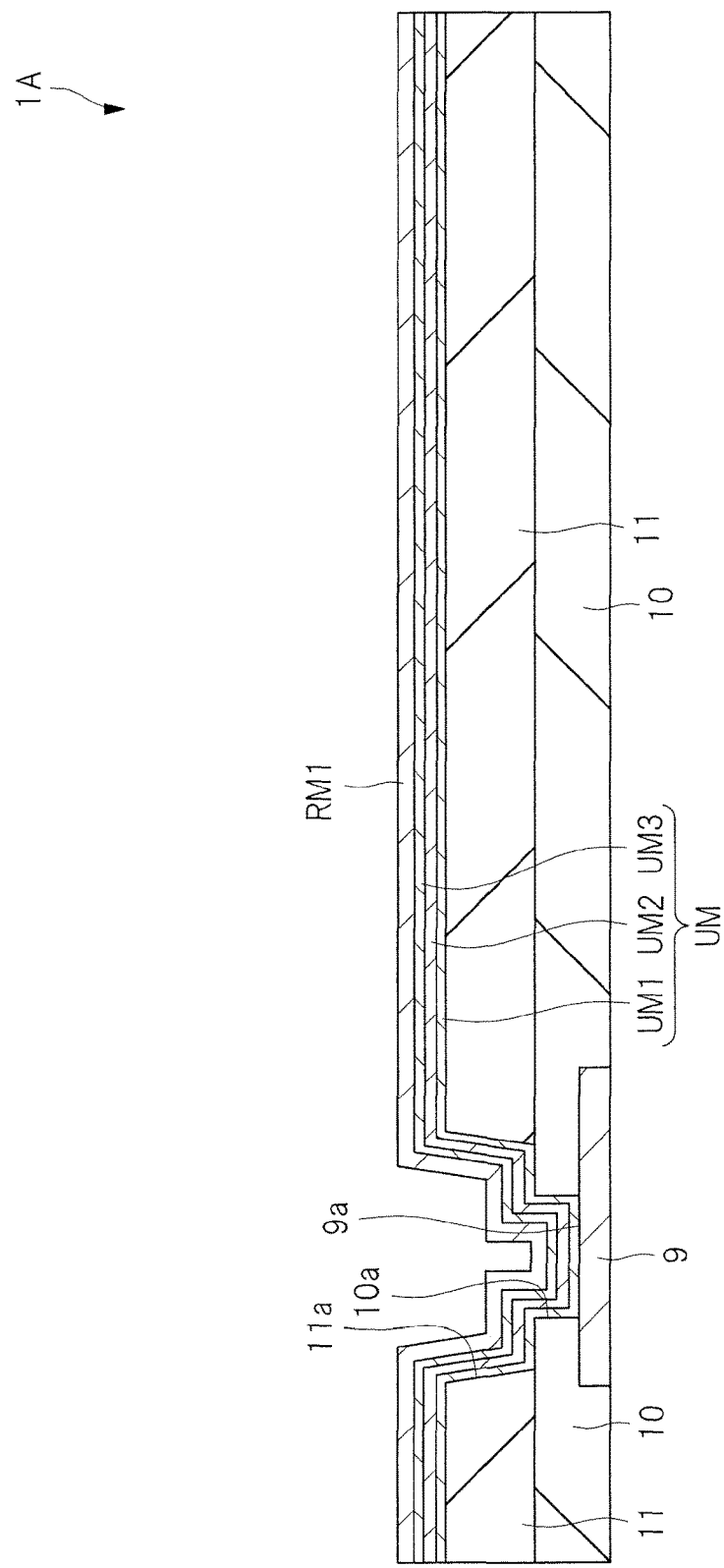
FIG. 6 is a cross-sectional view showing the manufacturing process of the semiconductor device continued from FIG. 5.

FIG. 6 shows a process of forming the base insulating film 11, the base metal film UM and the seed film RM1. First, the base insulating film 11 is formed on the surface protection film 10, and a photosensitive polyimide resin is used as the base insulating film 11. After applying and exposing the photosensitive polyimide on the surface protection film 10 to expose the pad opening 10a and the pad electrode 9a, curing is performed for hardening. Specifically, the base insulating film 11 having the opening 11a larger than the pad opening 10a and the pad electrode 9a is formed.

Next, the base metal film UM and the seed film RM1 electrically connected to the pad electrode 9a through the opening 11a and the pad opening 10a are formed (deposited). The first base barrier film UM1, the second base barrier film UM2 and the third base barrier film UM3 constituting the base metal film UM are preferably formed of a titanium (Ti) film with a thickness of 5 to 50 nm, a titanium nitride (TiN) film with a thickness of 10 to 100 nm and a titanium (Ti) film with a thickness of 5 to 50 nm, respectively. In this case, a titanium (Ti) film with a thickness of 10 nm, a titanium nitride (TiN) film with a thickness of 50 nm and a titanium (Ti) film with a thickness of 10 nm are formed as an example. These first base barrier film UM1, second base barrier film UM2 and third base barrier film UM3 are formed by, for example, the sputtering method. Then, the seed film RM1 made of a copper (Cu) film is formed on the third base barrier film UM3 by the sputtering method. The seed film RM1 has a thickness of about 250 nm.

Figure 7:
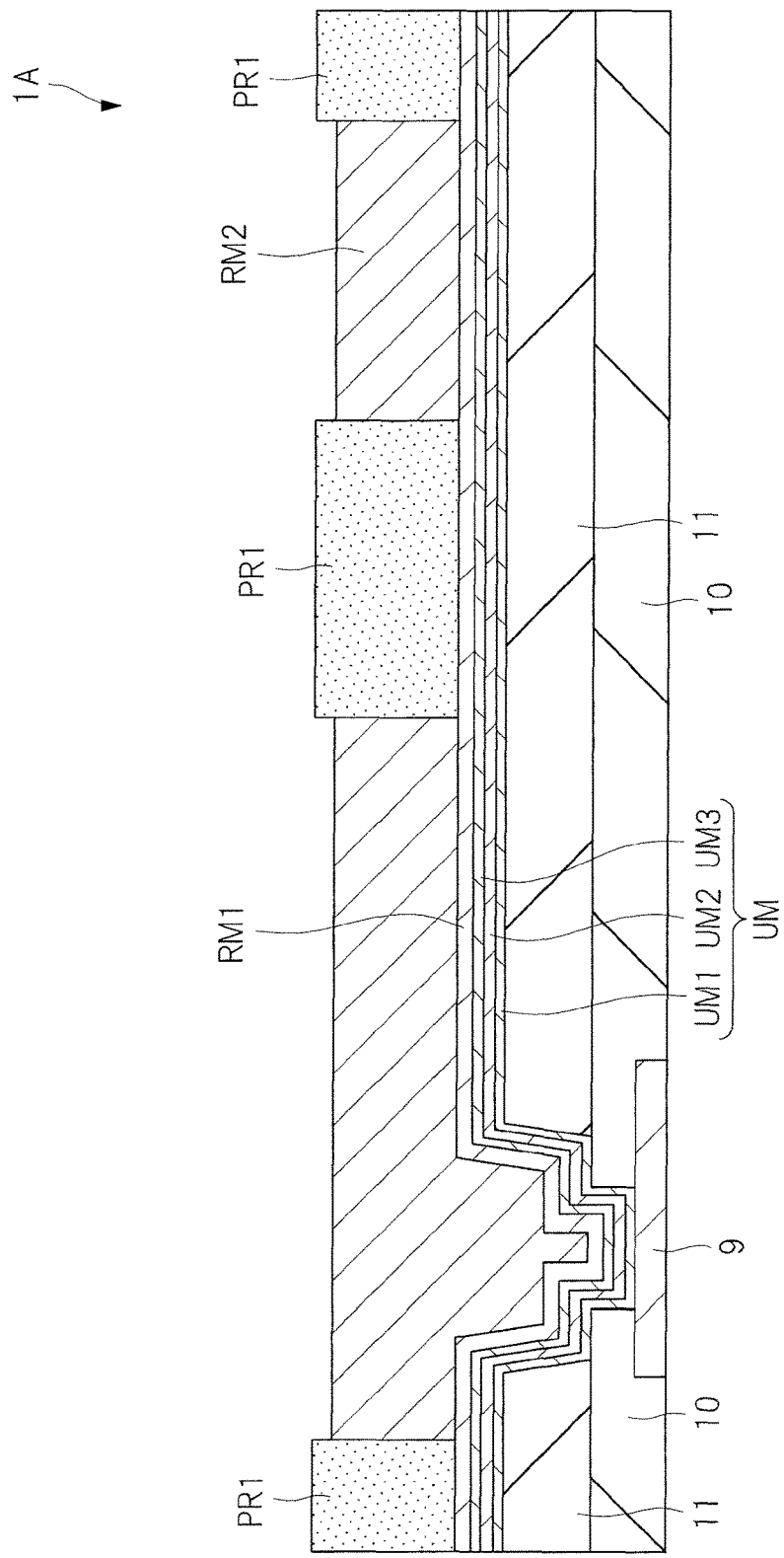
FIG. 7 is a cross-sectional view showing the manufacturing process of the semiconductor device continued from FIG. 6.

FIG. 7 shows a plating process in the process of forming the redistribution line RM. A resist mask (resist pattern) PR1 which exposes the formation region of the redistribution line RM and covers the region in which the redistribution line RM is not formed is formed on the seed film RM1. Specifically, the resist mask PR1 is a pattern reverse to the first planar pattern P1, and has an opening corresponding to the first planar pattern P1. Then, the plating film RM2 made of a copper (Cu) film is selectively formed on the seed film RM1 in the region exposed from the resist mask PR1 by the electrolytic plating (electroplating) using the base metal film UM and the seed film RM1 as seed layers. The thickness of the plating film RM2 is, for example, about 6 μm. The thickness of the plating film RM2 is preferably in the range of 2 to 10 μM, and since the resistance of the redistribution line RM is increased when the plating film RM2 is too thin, the plating film RM2 needs to have a thickness capable of obtaining the resistance value that can satisfy the demand of the device and a certain degree of thickness is necessary in general. However, when the plating film RM2 is too thick, the warp of the wafer is increased and the transfer error occurs in the subsequent lithography and processing apparatus, so that the processing becomes difficult and the problems of the increase in manufacturing cost and the decrease in productivity arise. Note that the same characters are attached to the base metal film UM and others before and after the patterning. In this process, the plating film RM2 having the first planar pattern F1 is formed.

Figure 8:
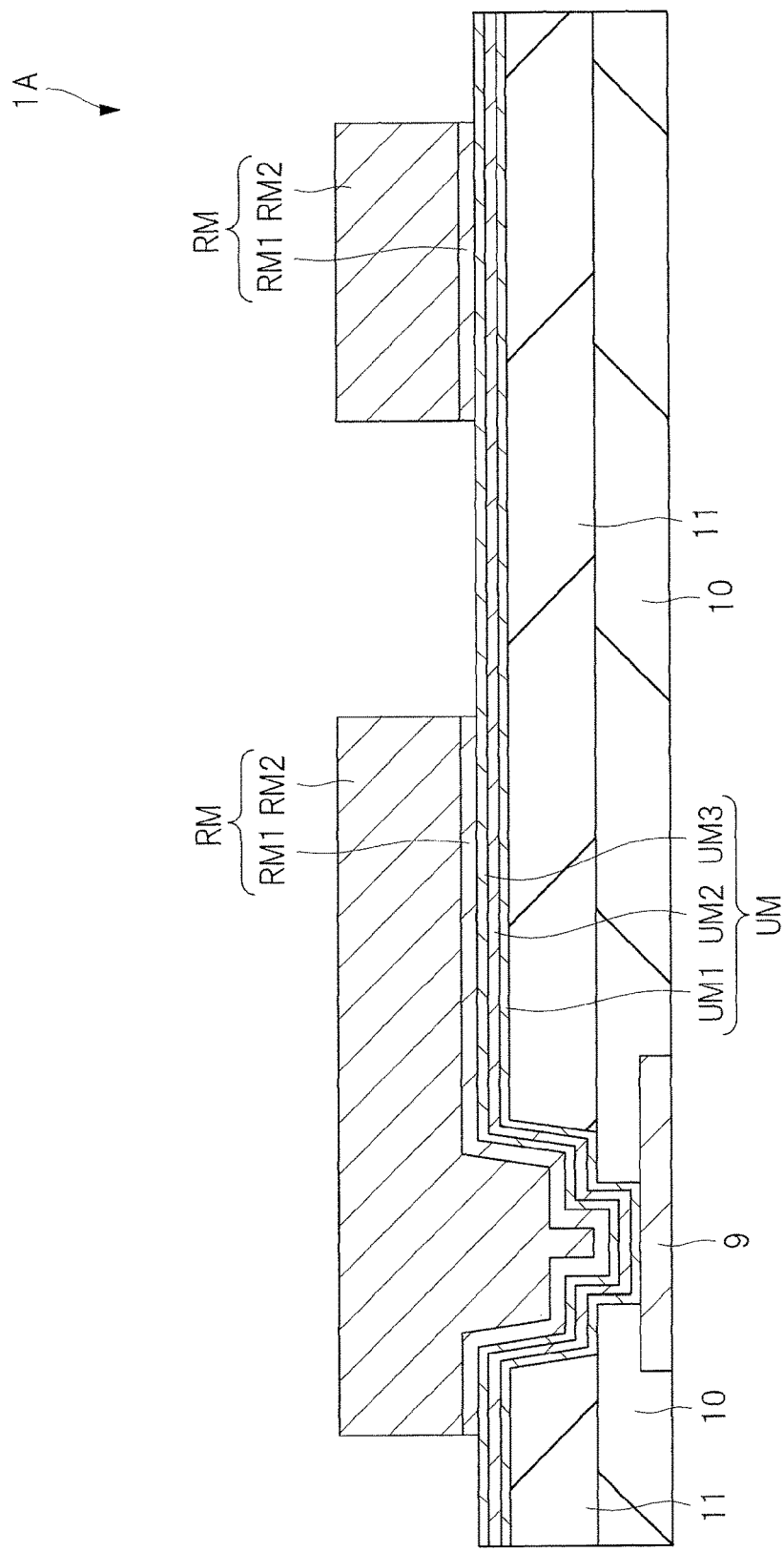
FIG. 8 is a cross-sectional view showing the manufacturing process of the semiconductor device continued from FIG. 7.

FIG. 8 shows a process of removing (processing) the seed film RM1 in the process of forming the redistribution line RM. After the plating film RM2 is formed, the resist mask PR1 is removed. Then, by removing the seed film RM1 in the region exposed from the plating film RM2, the patterned seed film RM1 having the same planar pattern as the plating film RM2 is left below the plating film RM2. In this process, the redistribution line RM having the first planar pattern P1 and constituted of the laminated structure of the seed film RM1 and the plating film RM2 is formed.

At this time, it is important that the base metal film UM in the region exposed from the plating film RM2 (in other words, the region outside the redistribution line RM) is left without being removed. However, since it is important that the base metal film UM is left in the region exposed from the plating film RM2, the base metal film UM in the region exposed from the plating film RM2 may be partly removed up to about the half thickness by etching. Namely, the thickness of the base metal film UM in the region exposed from the plating film RM2 may be reduced to about the half of the base metal film UM in the region covered with the plating film RM2. By reducing the thickness of the base metal film UM in the region exposed from the plating film RM2, the peeling of the base metal film UM from the base insulating film 11 can be prevented. By reducing the thickness of the base metal film UM, the stress of the base metal film UM can be reduced and the effect of reducing the peeling from the base insulating film 11 can be obtained. In this case, the etching is the dry etching including chlorine-based gas and performed with using the plating film RM2 or the seed film RM1 as a hard mask.

Figure 9:
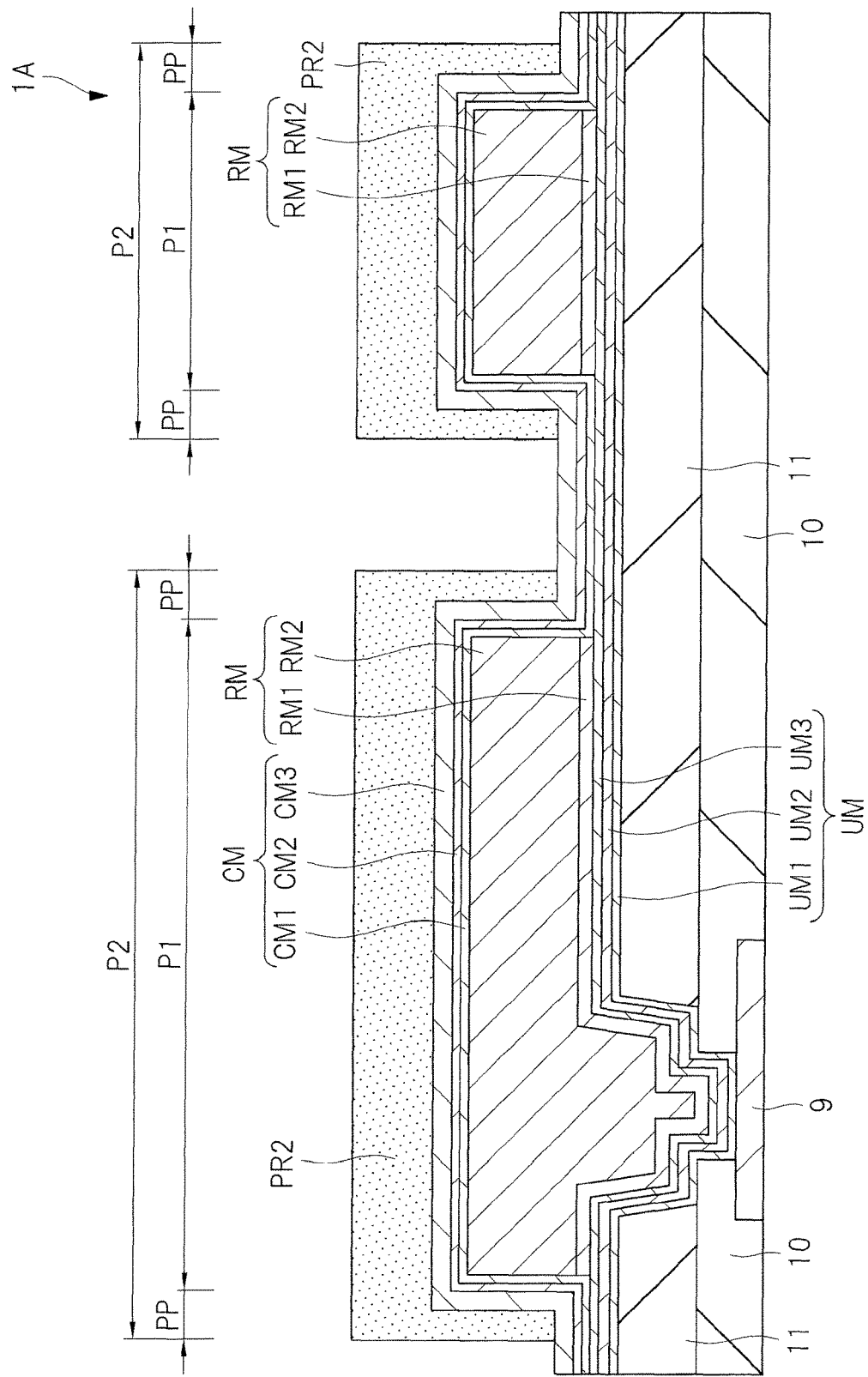
FIG. 9 is a cross-sectional view showing the manufacturing process of the semiconductor device continued from FIG. 8.

FIG. 9 shows a part of the process of forming the cap metal film CM. The cap metal film CM is formed (deposited) so as to completely cover the upper surface and the side surface of the redistribution line RM. The cap metal film CM before being patterned is referred to as a cap metal material film. The cap metal film CM is constituted of cap barrier films in a plurality of layers. For the formation of the cap metal film CM, a first cap barrier film (first cap metal material film) CM1, a second cap barrier film (second cap metal material film) CM2 and a third cap barrier film (third cap metal material film) CM3 are sequentially formed. In the first embodiment, the third cap barrier film CM3 is also treated as a part of the cap metal film CM. The first cap barrier film CM1, the second cap barrier film CM2 and the third cap barrier film CM3 are preferably formed of a titanium (Ti) film with a thickness of 10 to 200 nm, a palladium (Pd) film with a thickness of 10 to 200 nm and a titanium (Ti) film with a thickness of 10 to 200 nm, respectively. In this case, for example, the titanium (Ti) film of the lower layer has a thickness of 10 nm, the palladium (Pd) film has a thickness of 50 nm and the titanium (Ti) film of the upper layer has a thickness of 175 nm. Since the first cap barrier film CM1, the second cap barrier film CM2 and the third cap barrier film CM3 completely cover the side surface of the redistribution line RM, a conformal film formation method such as CVD method is preferably used, but the method is not limited to this.

Here, since the first cap barrier film CM1 in contact with the third base barrier film UM3 is made of the same material as the third base barrier film UM3, the adhesiveness between the third base barrier film UM3 and the first cap barrier film CM1 in the projecting part PP can be improved. In other words, since the film to be the upper surface of the base metal film UM with the laminated structure and the film to be the lower surface of the cap metal film CM with the laminated structure are made of the same material, the adhesiveness between the base metal film UM and the cap metal film CM in the projecting part PP can be improved, so that it is possible to prevent the movement (diffusion) of copper ions constituting the redistribution line RM to the outside and it is also possible to prevent the penetration of water and others from the base insulating film 11 or the protection film 12.

In addition, it is desirable that the hydrogen plasma treatment is performed to the surface of the redistribution line RM and the base metal film UM (in particular, third base barrier film UM3) before forming the first cap barrier film CM1 so as to clean the upper surface and the side surface of the redistribution line RM and the upper surface of the base metal film UM by removing the oxide film thereon, thereby improving the adhesiveness between the base metal film UM and the cap metal film CM.

Next, as shown in FIG. 9, a resist mask PR2 is formed on the third cap barrier film CM3. The resist mask PR2 corresponds to the second planar pattern P2, and has a pattern that covers the redistribution line RM and the projecting part PP around the redistribution line RM and exposes the others when seen in a plan view.

Figure 10:
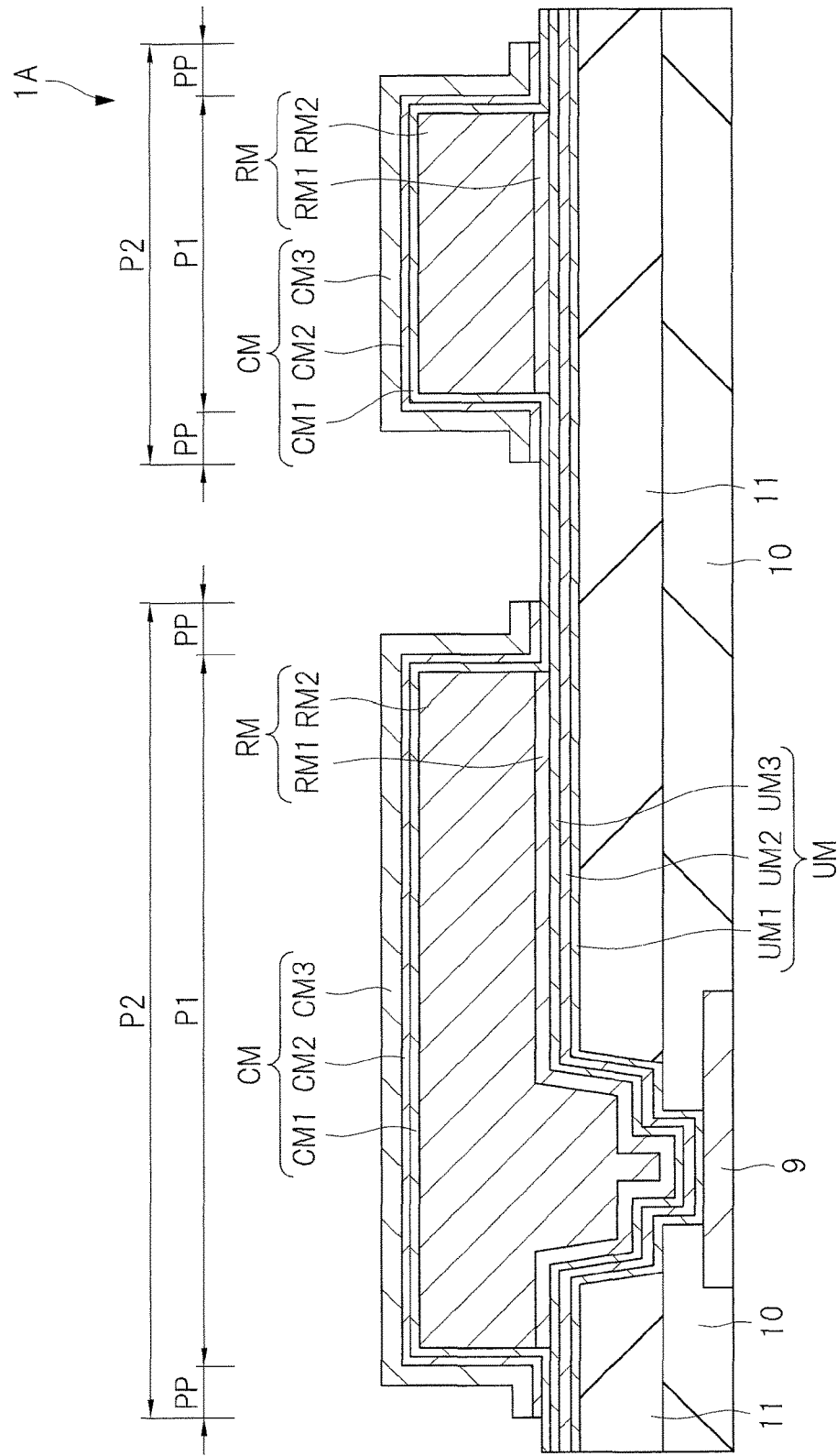
FIG. 10 is a cross-sectional view showing the manufacturing process of the semiconductor device continued from FIG. 9.

FIG. 10 shows a part of the process in the process of forming the cap metal film CM continued from FIG. 9. The third cap barrier film CM3 in the region exposed from the resist mask PR2 is removed by the dry etching or the wet etching, thereby forming the third cap barrier film CM3 having the second planar patter P2. The third cap barrier film CM3 made of a titanium (Ti) film is wet-etched with the ammonia aqueous solution. Namely, the third cap barrier film CM3 is patterned with using the resist mask PR2.

Next, the resist mask PR2 is removed. Then, the second cap barrier film CM2 is etched with using the third cap barrier film CM3 made of the patterned titanium (Ti) film as a hard mask, thereby forming the second cap barrier film CM2 having the second planar pattern P2. The second cap barrier film CM2 made of a palladium (Pd) film is wet-etched with iodine-potassium iodide solution, but it may be etched by the dry etching. Namely, the second cap barrier film CM2 is patterned (etched) with using the third cap barrier film CM3 as a mask.

Even when the wet etching is performed to the third cap barrier film CM3 and the second cap barrier film CM2, since the base metal film UM is present in the projecting part PP which is the region outside the redistribution line RM and the cap metal film CM and the base metal film UM are in direct contact with each other in the projecting part PP, the etchant does not reach the redistribution line RM.

Figure 11:
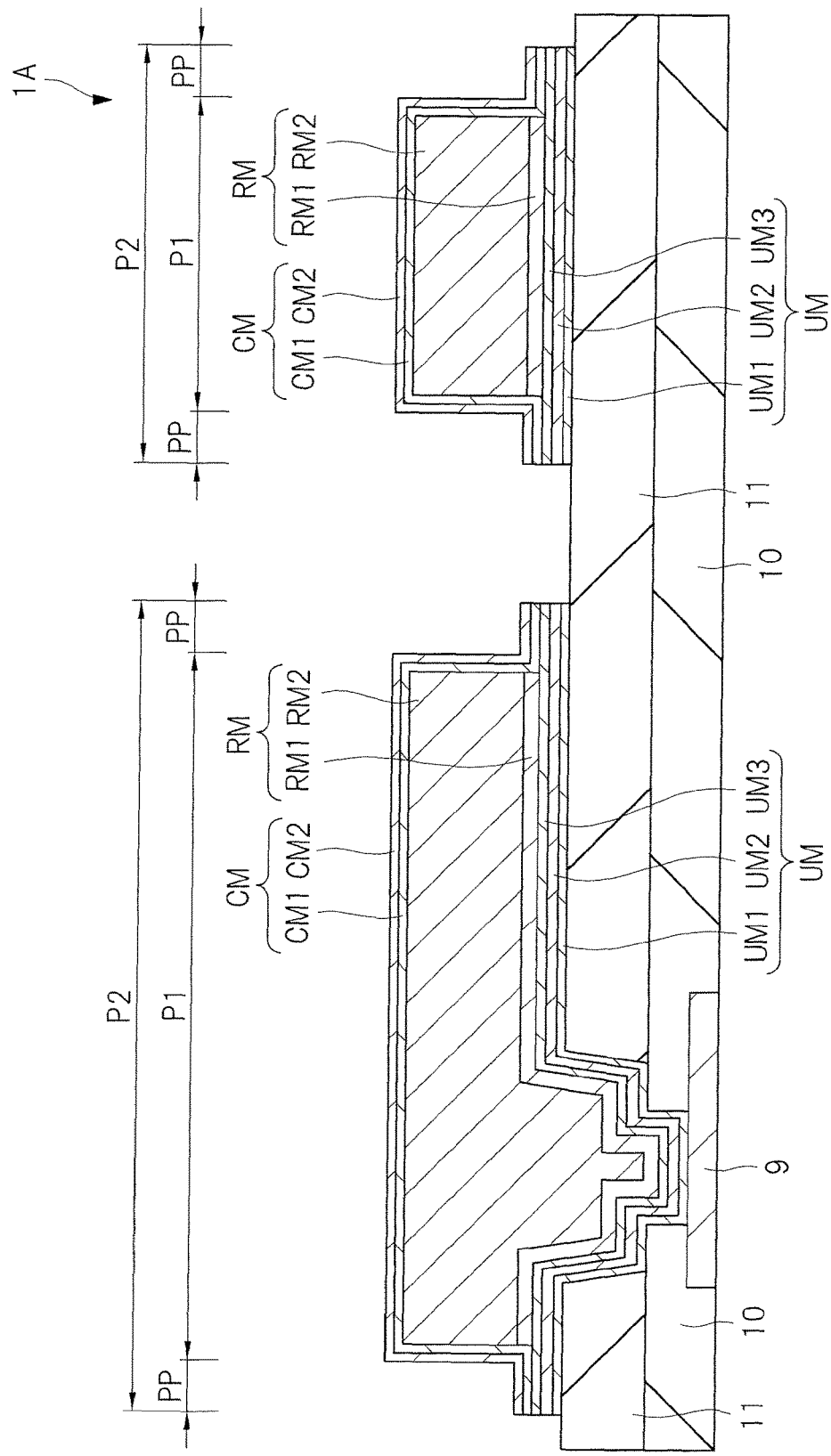
FIG. 11 is a cross-sectional view showing the manufacturing process of the semiconductor device continued from FIG. 10.

FIG. 11 shows a part of the process of forming the cap metal film CM and a process of processing the base metal film UM continued from FIG. 10. The first cap barrier film CM1 and the base metal film UM in the region exposed from the third cap barrier film CM3 and the second cap barrier film CM2 are removed by etching, thereby exposing the upper surface of the base insulating film 11. Since the first cap barrier film CM1 and the base metal film UM are formed of a titanium (Ti) film and a titanium nitride (TiN) film, the first cap barrier film CM1 and the base metal film UM having the second planar pattern P2 can be formed by removing the first cap barrier film CM1 and the base metal film UM by the wet etching using the ammonia aqueous solution. At this time, the third cap barrier film CM3 formed of a titanium (Ti) film is simultaneously removed, and the upper surface of the second cap barrier film CM2 is exposed. By setting the thickness of the third cap barrier film CM3 so as to have an equal etching time to that of the first cap barrier film CM1 and the base metal film UM, the side etching of the first cap barrier film CM1 and the base metal film UM with respect to the end of the second cap barrier film CM2 can be reduced.

Through the process described above, the cap metal film. CM covering the upper surface and the side surface of the redistribution line RM and the base metal film UM in contact with the lower surface thereof of the redistribution line RM are separated from those of an adjacent redistribution line RM, and the cap metal film CM and the base metal film UM having the equal second planar pattern P2 are formed. Here, "equal" includes the case where there is a dimensional difference due to the side etching mentioned above.

Even when the wet etching is performed to the third cap barrier film CM3, the first cap barrier film CM1 and the base metal film UM, since the base metal film UM is present in the projecting part PP which is the region outside the redistribution line RM and the cap metal film CM and the base metal film UM are in direct contact with each other in the projecting part PP, the etchant does not reach the redistribution line RM.

Figure 12:
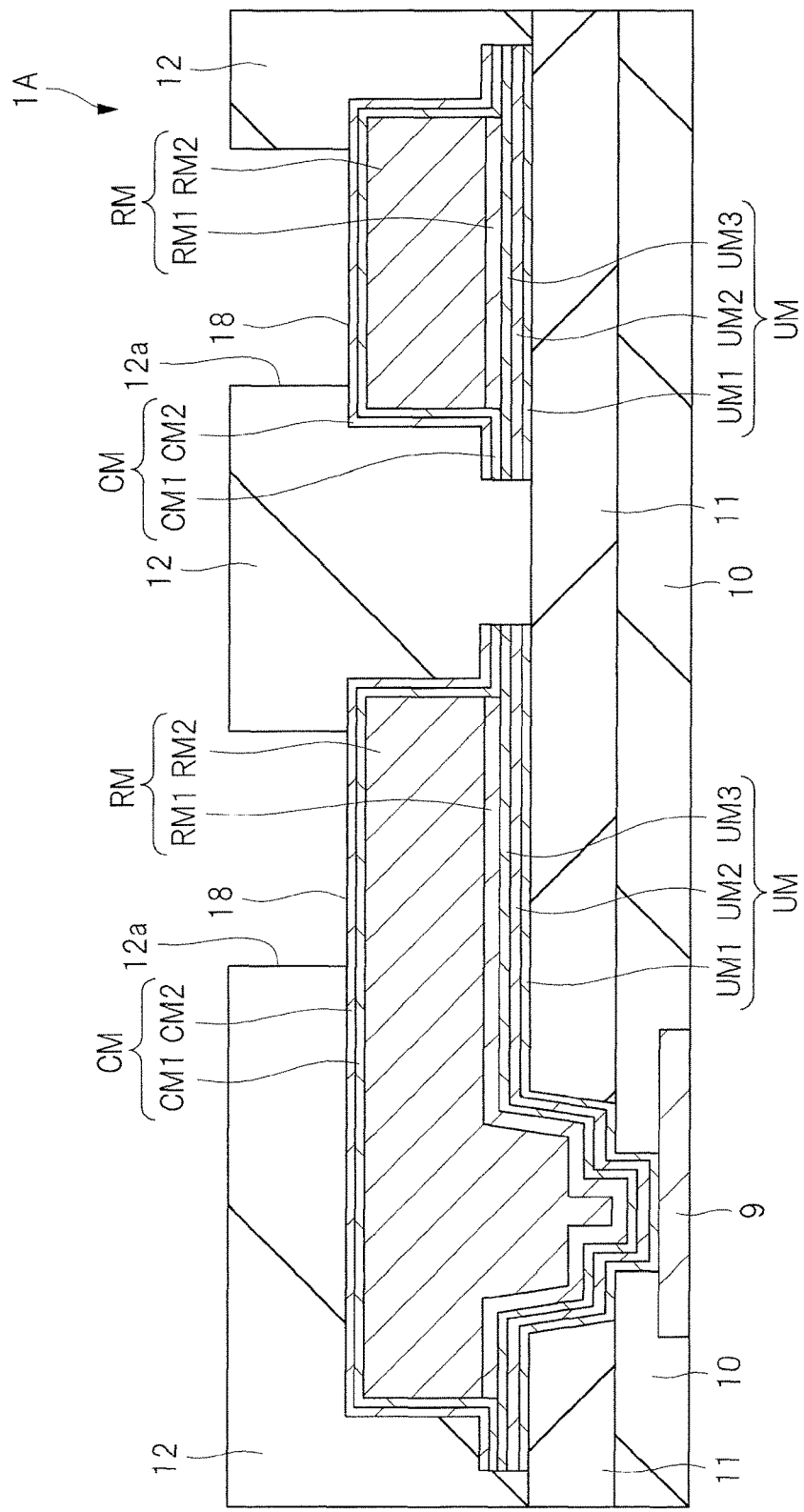
FIG. 12 is a cross-sectional view showing the manufacturing process of the semiconductor device continued from FIG. 11.

FIG. 12 shows a process of forming the protection film 12. The protection film 12, which covers the upper surface and the side surface of the redistribution line RM and has the opening 12a which exposes the external pad electrode 18 provided on the upper surface of the redistribution line RM, is formed. The protection film 12 is thicker than the redistribution line RM and is in contact with the upper surface of the base insulating film 11 in the region between the adjacent redistribution lines RM. As the protection film 12, for example, photosensitive polyimide resin is used. After applying and exposing the photosensitive polyimide on the redistribution line RM to form the opening 12a which exposes the external pad electrode 18, curing is performed for hardening.

Figure 13:
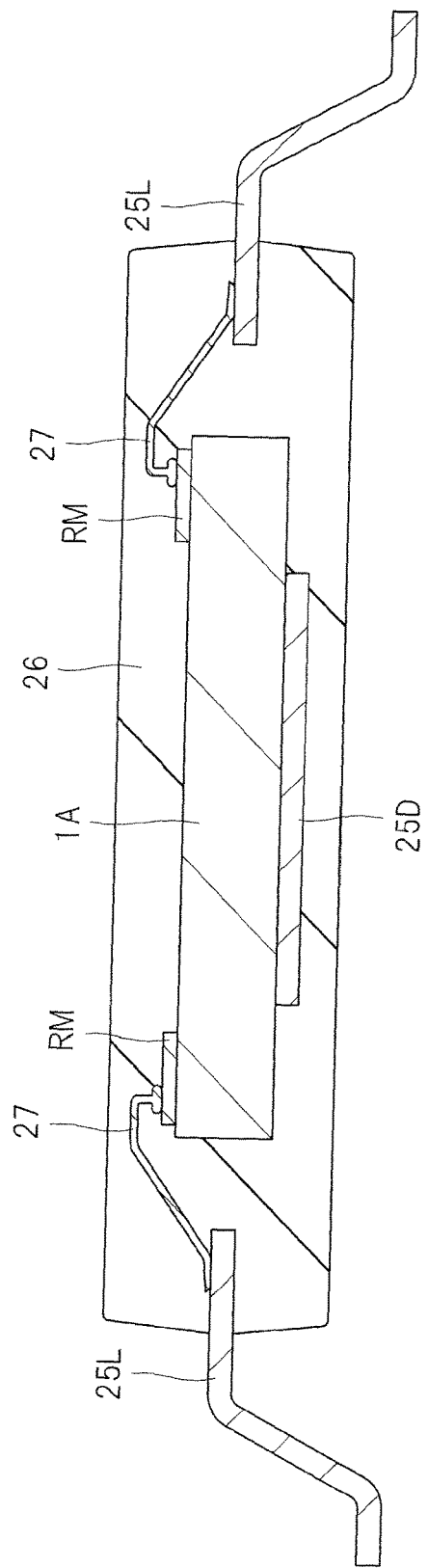
FIG. 13 is a cross-sectional view showing the manufacturing process of the semiconductor device continued from FIG. 12.

FIG. 13 shows amounting process of the semiconductor chip 1A. After the process described above, the semiconductor chip 1A is mounted on a die pad part 25D and the redistribution line RM is connected to a lead 25L by a wire 27. Then, a part of the lead 25L (inner lead part), the die pad part 25D, the semiconductor chip 1A and the wire 27 are sealed with a sealing member (sealing resin) 26, so that the semiconductor device (semiconductor integrated circuit device) of the first embodiment is completed.

As shown in FIG. 13, the semiconductor chip 1A having the plurality of redistribution lines RM is mounted on the die pad part 25 and is electrically connected to the plurality of leads 25L by the wires 27. A part of the lead 25L (inner lead part), the die pad part 25D, the semiconductor chip 1A and the wire 27 are sealed with a sealing member (sealing resin) 26 made of, for example, thermosetting epoxy resin. Also, the sealing member 26 contains filler such as silica ($SiO_2$) in addition to the epoxy resin. The lead 25 has an outer lead part extending to the outside of the sealing member 26 from the inner lead part covered with the sealing member 26.

One end of the wire 27 is connected to the external pad electrode 18 formed on the upper surface of the redistribution line RM of the semiconductor chip 1A shown in FIG. 4 or 12, and the other end thereof is connected to the inner lead part of the lead 25L. The die pad part 25D and the plurality of leads 25L are made of, for example, copper (Cu) or 42 alloy (iron-nickel alloy), and the wire 27 is made of copper (Cu).

Since the second cap barrier film CM2 made of a palladium (Pd) film is exposed on the surface of the external pad electrode 18 and the wire 27 made of copper is bonded and connected to the second cap barrier film CM2 made of a palladium (Pd) film, the stable joint with a sufficient bonding strength can be achieved, and the highly reliable bonding with a high shear strength can be achieved.

Note that a copper wire whose surface is coated with palladium (Pd) (Pd-coated Cu wire) or a gold wire (Au wire) may be used as the wire 27.

Although a titanium (Ti) film is used as the first cap barrier film CM1, the first cap barrier film CM1 may be a film made of alloy containing Ni, Mo, W, Co, Ru, Ta or others as a main component or a laminated film made of these metals. In addition, although a titanium (Ti) film is used as the third base barrier film UM3, the third base barrier film UM3 may be a film made of metal such as Ni, Mo, W, Co, Ru or Ta, nitride thereof, carbide thereof or alloy containing one of these metals as a main component or a laminated film made of these metals.

<Characteristics of Manufacturing Method of Semiconductor Device>

Hereinafter, main characteristics of the manufacturing method of the semiconductor device of the first embodiment will be described.

As described above with reference to FIG. 10 and FIG. 11, in the etching process of the second cap barrier film CM2 and the etching process of the first cap barrier film CM1 and the third cap barrier film CM3, the base metal film UM continuously extends from below the redistribution line RM to the projecting part PP which is the region outside the redistribution line RM. In addition, the base metal film UM is present between the cap metal film CM and the base insulating film 11 formed on the side surface (side wall) of the redistribution line RM. Therefore, it is possible to prevent the occurrence of failure such as the peeling of the copper (Cu) film constituting the redistribution line RM in both of the etching processes mentioned above. This effect will be described below.

Figure 18:
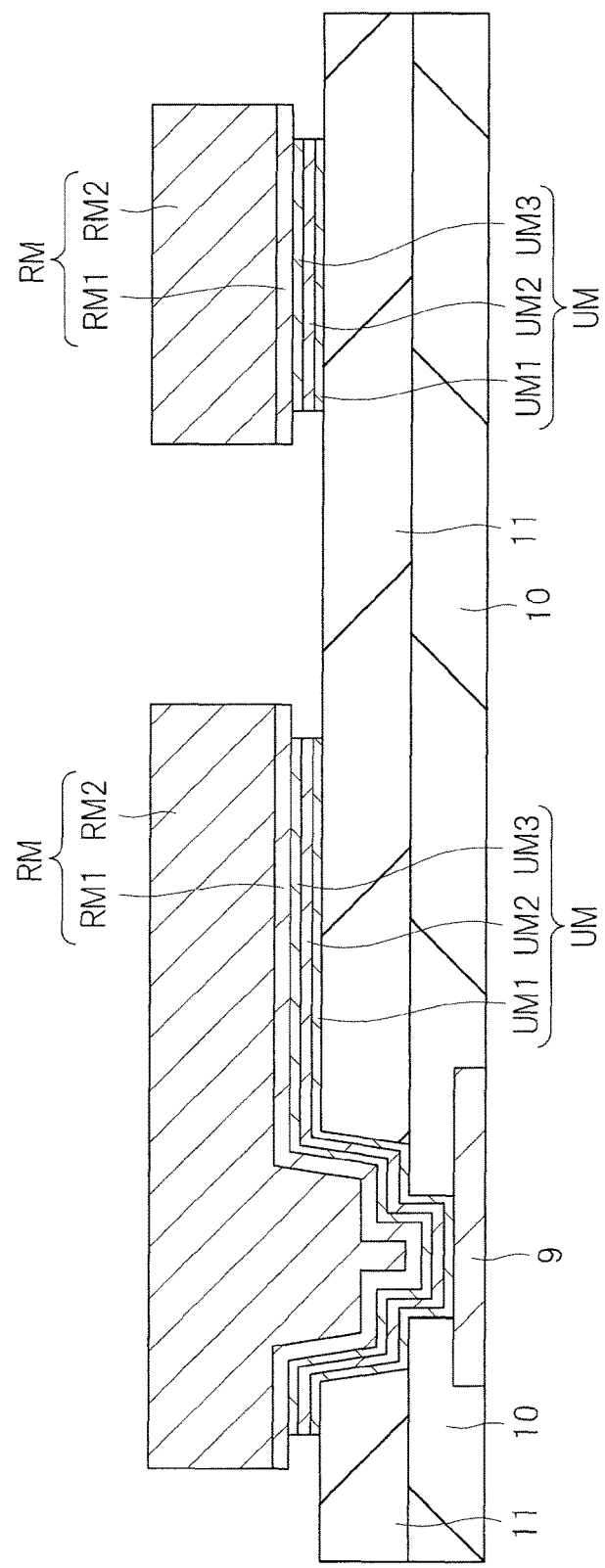
FIG. 18 is a cross-sectional view showing a manufacturing process of a semiconductor device of a comparative example.
Figure 19:
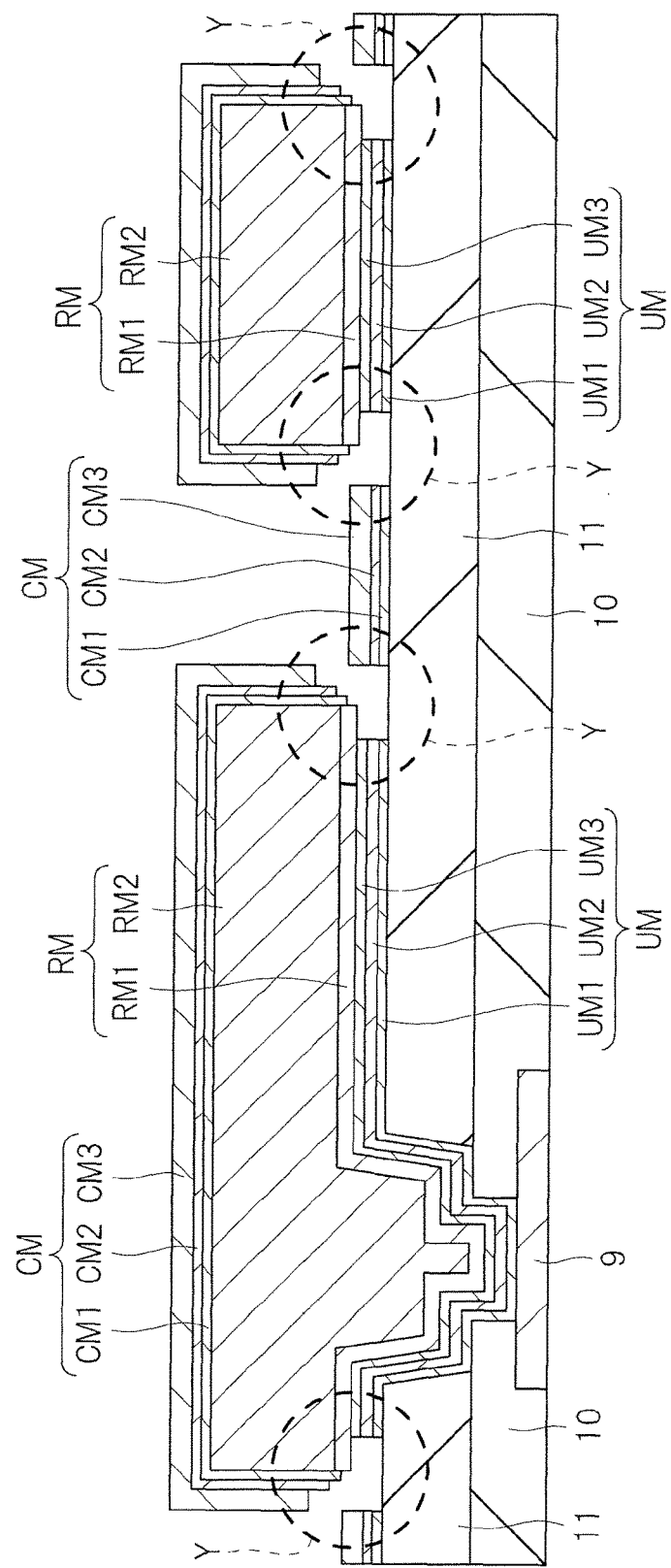
FIG. 19 is a cross-sectional view showing the manufacturing process of the semiconductor device of the comparative example continued from FIG. 18.

FIG. 18 and FIG. 19 are cross-sectional views showing a manufacturing process of a semiconductor device of a comparative example of the first embodiment.

FIG. 18 shows the state in which the base metal film UM in the region exposed from the plating film RM2 has been removed after the process of removing the seed film RM1 described with reference to FIG. 8. Unlike the manufacturing method of the first embodiment described above, since the base metal film UM in the region exposed from the plating film RM2 or the seed film RM1 is completely removed after removing the seed film RM1, the over-etching is indispensable in the etching process of the base metal film UM. Specifically, as shown in FIG. 18, the side etching in which the end of the base metal film UM recedes from the end of the redistribution line RM occurs, and the structure in which the redistribution line RM overhangs like an eave from the end of the base metal film UM is formed.

Next, the cap metal film CM is deposited on the upper surface and the side surface of the redistribution line RM as shown in FIG. 19, but the examination by the inventors of this application has revealed that a discrete portion of the cap metal film CM called "step disconnection" is formed in the areas surrounded by the broken lines Y of FIG. 19. In addition, it has been found that this step disconnection occurs due to the side etching of the base metal film UM mentioned above and the etchan: penetrates to the redistribution line RM or the base metal film UM below the redistribution line RM from the step disconnection part in the etching process of the cap metal film CM, so that a part of the redistribution line RM peels off.

In the comparative example, after the seed film RM1 is removed, the base metal film UM in the region exposed from the plating film RM2 is completely removed in succession. In the first embodiment, however, since the base metal film UM is left until the step of removing the cap metal film CM in the region outside the redistribution line RM and the base metal film UM in the region outside the redistribution line RM is removed subsequently to (or simultaneously with) the removal of the cap metal film CM, it is possible to prevent the step disconnection and the peeling of the redistribution line RM mentioned above.

Further, since the second cap barrier film CM2 made of a palladium (Pd) film is exposed on the surface of the external pad electrode 18 and the wire 27 made of copper is bonded and connected to the second cap barrier film CM2 made of a palladium (Pd) film, the stable joint with a sufficient bonding strength can be achieved.

Modified Example 1

Figure 14:
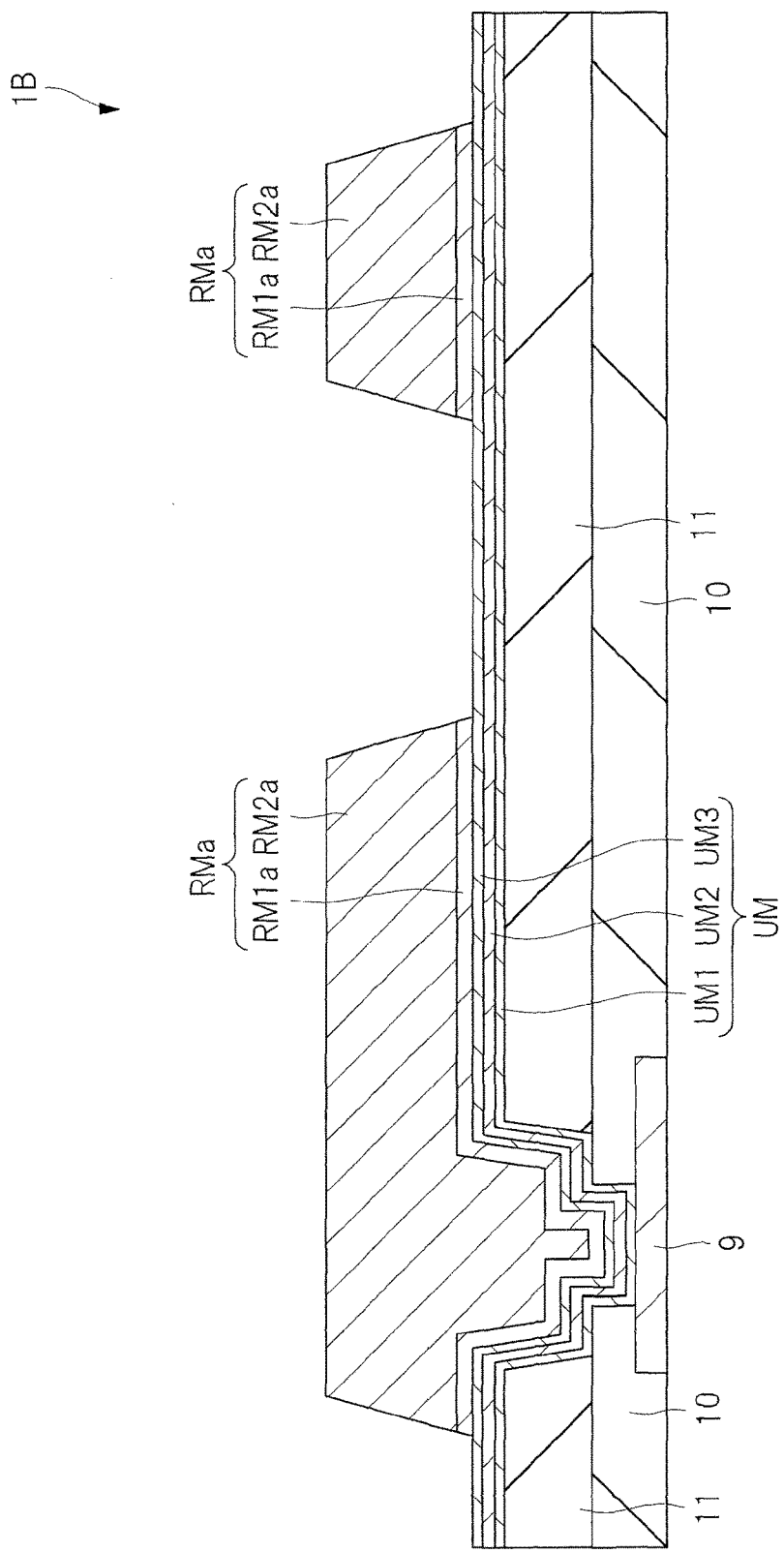
FIG. 14 is a cross-sectional view showing a manufacturing process of a semiconductor device of a modified example 2.

FIG. 14 is a cross-sectional view showing a manufacturing process of a semiconductor device of a modified example 1 of the first embodiment.

In the manufacturing method of a semiconductor chip 1B, a process of forming the side surface (side wall) of the redistribution line RM into a forward-tapered shape is added between the process of removing the seed film RM1 described with reference to FIG. 8 and the process of forming the cap metal film CM described with reference to FIG. 9. Specifically, by performing the argon (Ar) sputter etching to the redistribution line RM, a trapezoidal redistribution line RMa having forward-tapered side surfaces when seen in a cross-sectional view can be obtained. It could be said that the trapezoidal shape is the shape in which the lower surface of the redistribution line RM is wider than the upper surface thereof or the shape in which the width of the lower surface is larger than the width of the upper surface when seen in a cross-sectional view. In addition, the redistribution line RMa has a laminated structure of a seed film RM1a and a plating film RM2a, and the side surfaces of the seed film RM1a and the plating film RM2a have the continuous forward-tapered shape.

When the plating film RM2 is formed by the electrolytic plating method described with reference to FIG. 7, since the side surface of the resist mask PR1 has a forward-tapered shape, the side surface of the plating film RM2 is reverse-tapered, and the plating film RM2 has an inverted trapezoidal shape when seen in a cross-sectional view. When the side surface is reverse-tapered, the coatability of the cap metal film CM formed so as to cover the side surface of the redistribution line RM is degraded, and the cap metal film CM including a discrete portion or a pin hole is formed. As a result, it has been found by the examination by the inventors of this application that the etchant penetrates to the redistribution line RM in the wet etching process of the cap metal film CM and the etching of the side surface of the redistribution line RM (abnormal etching) occurs.

By forming the side surface of the redistribution line RM into a forward-tapered shape, it is possible to prevent the occurrence of the discrete portion of the cap metal film CM and the pin hole and it is possible to prevent the abnormal etching of the redistribution line RM.

The process described above is followed by the process of forming the cap metal film CM in the first embodiment.

Modified Example 2

Figure 15:
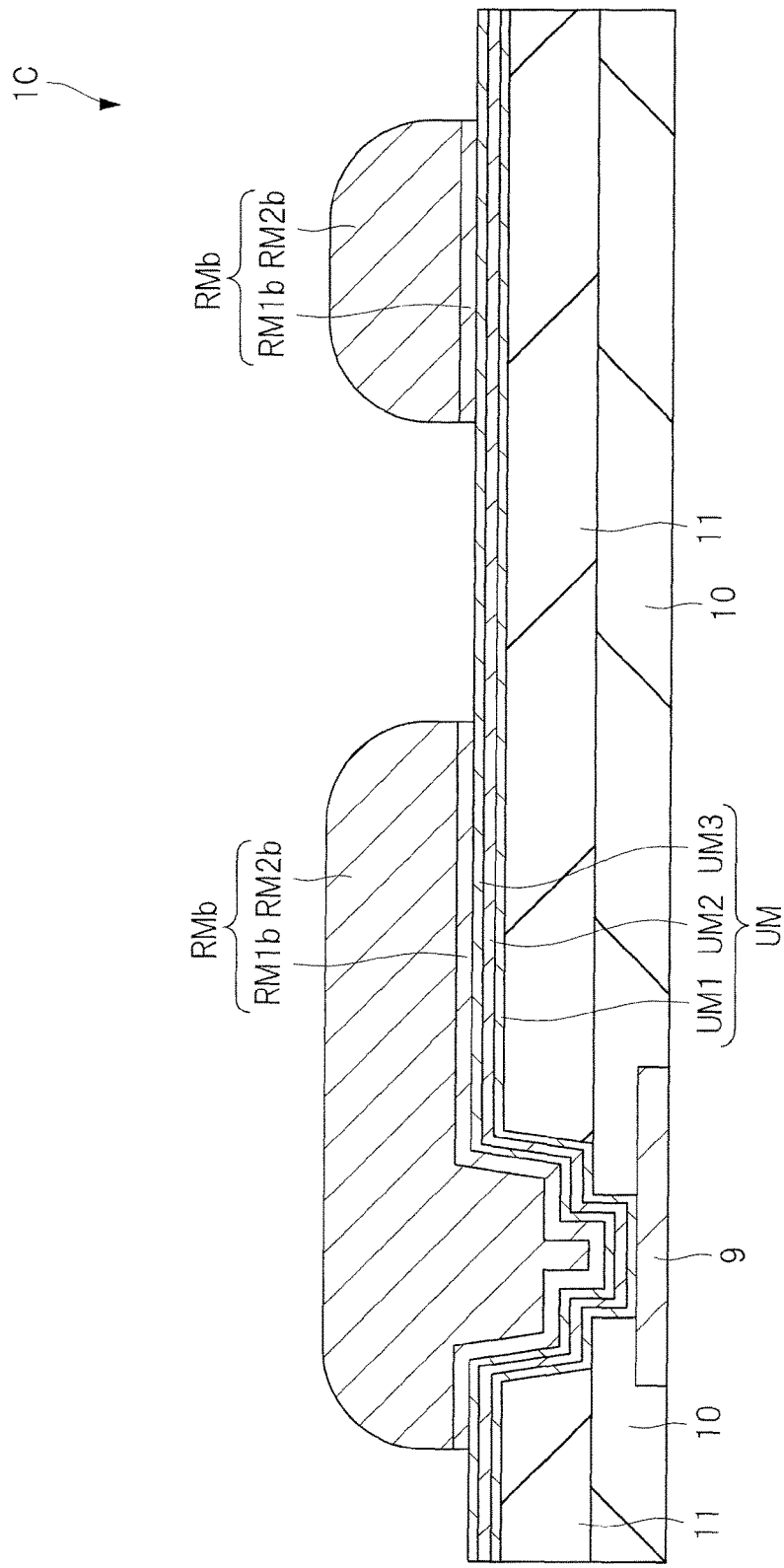
FIG. 15 is a cross-sectional view showing a manufacturing process of a semiconductor device of a modified example 2.

FIG. 15 is a cross-sectional view showing a manufacturing process of a semiconductor device of a modified example 2 of the first embodiment.

In the manufacturing method of a semiconductor chip 1C, a process of rounding the shoulder portion or the entire side surface of the redistribution line RM is added between the process of removing the seed film RM1 described with reference to FIG. 8 and the process of forming the cap metal film CM described with reference to FIG. 9. Specifically, by performing the reflow (heat treatment) to the redistribution line RM, a redistribution line RMb with a rounded shoulder portion can be formed. For example, after an oxide film on the surface of the copper film of the redistribution line RM is reduced by the hydrogen (H$_2$) plasma treatment or the annealing at the temperature of about 300 to 450° C. in the hydrogen (H$_2$) atmosphere, the annealing is performed at 300 to 450° C. to reflow the copper film. In addition, the redistribution line RMb has a laminated structure of the seed film RM1b and the plating film RM2b.

Since the shoulder portion of the redistribution line RM is rounded to have a smooth side surface, the coatability of the cap metal film CM is improved, and it is possible to prevent the abnormal etching of the redistribution line RM due to the discrete portion or the pin hole of the cap metal film CM.

The process described above is followed by the process of forming the cap metal film CM in the first embodiment.

Modified Example 3

Figure 16:
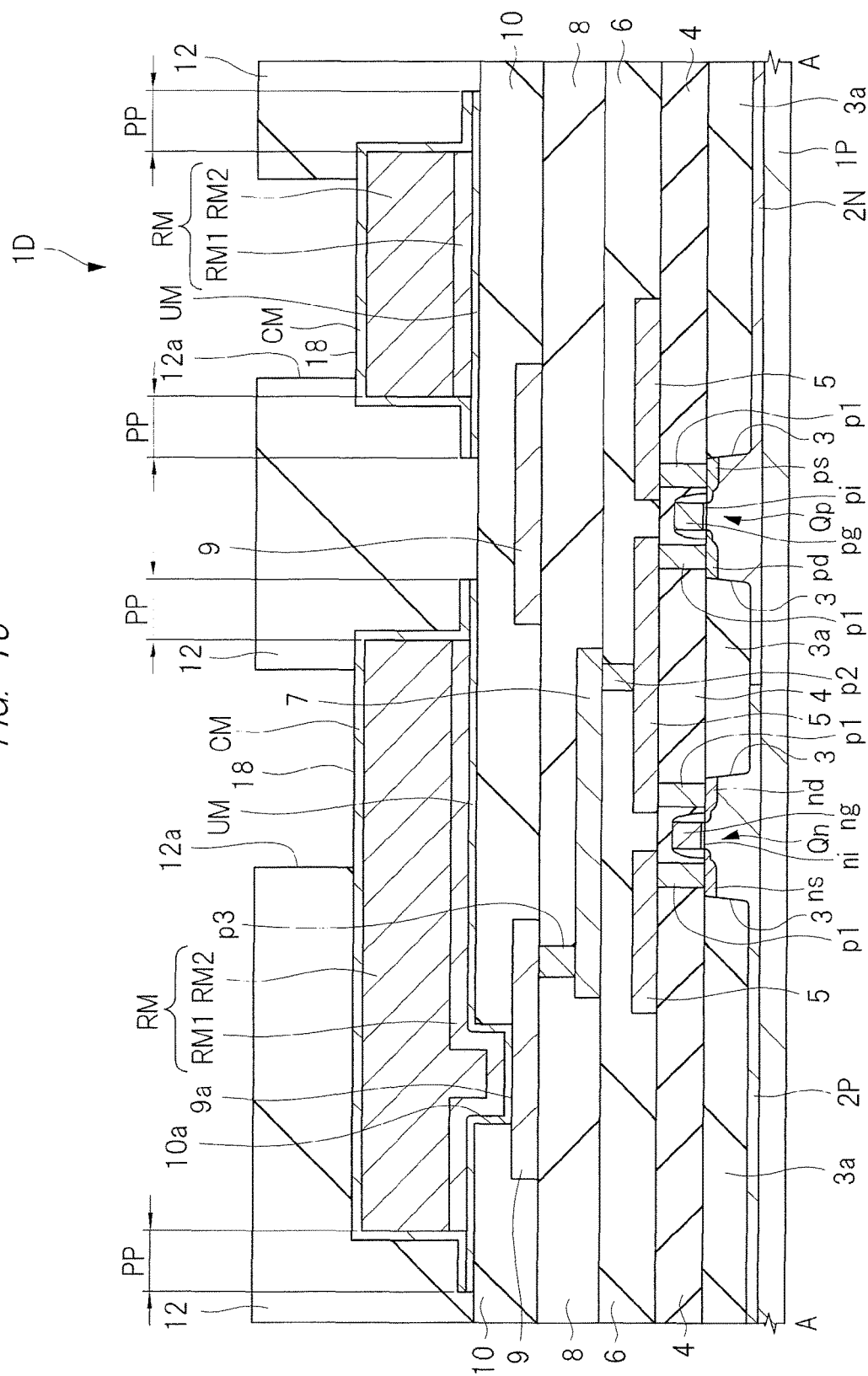
FIG. 16 is a cross-sectional view showing a manufacturing process of a semiconductor device of a modified example 3.

FIG. 16 is a cross-sectional view showing a manufacturing process of a semiconductor device of a modified example 3 of the first embodiment.

FIG. 16 shows a semiconductor chip 1D which is a modified example of the semiconductor chip 1A shown in FIG. 4, and the difference from the semiconductor chip 1A lies in that the redistribution line RM is disposed without interposing the base insulating film 11 on the surface protection film 10. The base metal film UM is in contact with and electrically connected to the pad electrode 9a, and extends on the side wall and the upper surface of the surface protection film 10 in the pad opening 10a of the surface protection film 10. The lower surface of the base metal film UM is in contact with the upper surface of the surface protection film 10. The base metal film UM in contact with the lower surface of the redistribution line RM and the cap metal film CM are the same as those of the first embodiment. In addition, other structure and manufacturing method thereof are also the same as those of the first embodiment.

With the structure in which the lower surface of the redistribution line RM is completely covered with the base metal film UM, the upper surface and the side surface thereof are completely covered with the cap metal film CM, and the base metal film UM and the cap metal film CM are in direct contact with each other in the projecting part PP, it is possible to prevent the copper constituting the redistribution line RM from being copper ions and moving (diffusing) to the outside. In addition, it is possible to prevent the copper film constituting the redistribution line RM from being oxidized by water or halogen ions contained in the protection film 12 or the sealing member 26. Namely, since the electrical reliability between adjacent redistribution lines RM can be improved, it is possible to omit the base insulating film 11 shown in FIG. 4.

Since the protection film 12 made of an organic film is provided on the redistribution line RM and the surface protection film, even when the semiconductor chip 1D is sealed with the sealing member 26 containing silica as shown in FIG. 13, it is possible to prevent the occurrence of cracks in the surface protection film 10 due to the contact between the sealing member 26 and the surface protection film 10.

As described above, since it is possible to improve the electrical reliability between the adjacent redistribution lines RM, the protection film 12 can also be omitted in addition to the base insulating film 11. With the structure described above, even when water and halogen ions are contained in the sealing member 26, it is possible to prevent the penetration of the water and halogen ions into the redistribution line RM.

Modified Example 4

Figure 17:
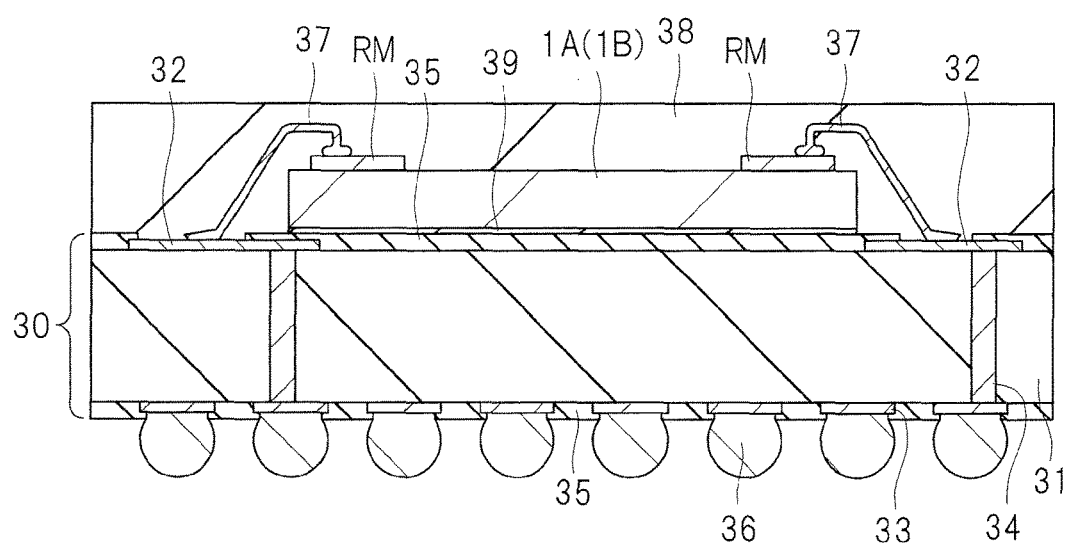
FIG. 17 is a cross-sectional view showing a manufacturing process of a semiconductor device of a modified example 4.

FIG. 17 is a cross-sectional view showing a manufacturing process of a semiconductor device of a modified example 4 of the first embodiment.

FIG. 17 shows a modified example of the mounting process described with reference to FIG. 13. After the semiconductor chip 1A is mounted on a wiring board 30 via an adhesive layer 39 and the redistribution line RM and a bonding finger 32 are connected by a wire 37, an upper surface of the wiring board 30, the semiconductor chip 1A and the wire 37 are sealed with a sealing member (sealing resin) 38, so that the semiconductor device (semiconductor integrated circuit device) of the modified example 4 is completed.

As shown in FIG. 17, the wiring board 30 has a plurality of bonding fingers 32 made of a conductor layer on an upper surface of a core layer 31 made of an insulating layer, and has a plurality of lands 33 made of a conductor layer on a lower surface thereof. The plurality of bonding fingers 32 are electrically insulated by a solder resist 35 made of an insulating layer, and the plurality of lands 33 are electrically insulated by the solder resist 35. Furthermore, the bonding finger 32 and the land 33 are electrically connected to each other through an internal-via wiring 34 made of a conductor layer formed in the core layer 31, and a clamp electrode 36 made of solder is connected to the land 33. Furthermore, the sealing member 38 is made of, for example, thermosetting epoxy resin and contains filler such as silica (SiO$_2$).

One end of the wire 37 is connected to the external pad electrode 18 formed on the upper surface of the redistribution line RM of the semiconductor chip 1A shown in FIG. 4 or FIG. 16, and the other end thereof is connected to the bonding finger 32. The wire 27 is a copper (Cu) wire, and a copper wire whose surface is coated with palladium (Pd) (Pd-coated Cu wire) or a gold wire (Au wire) may also be used as the wire 27.

In addition, although the example in which the external pad electrode 18 and the bonding finger 32 are electrically connected by the wire has been described above, it is also possible to employ the structure in which a solder ball is formed on the external pad electrode 18 on the upper surface of the redistribution line RM and the external pad electrode 18 and the bonding finger 32 are electrically connected by the solder ball. In this case, it is desirable that the side of the semiconductor chip 1A on which the redistribution line RM is formed is made to face the upper surface of the wiring board 30 and the external pad electrode 18 and the bonding finger 32 are connected by the solder ball.

Note that semiconductor chips 1B to 1F can also be mounted in the same manner instead of the semiconductor chip 1A.

Second Embodiment

The second embodiment corresponds to a modified example of the manufacturing method of the semiconductor device of the first embodiment.

Figure 20:
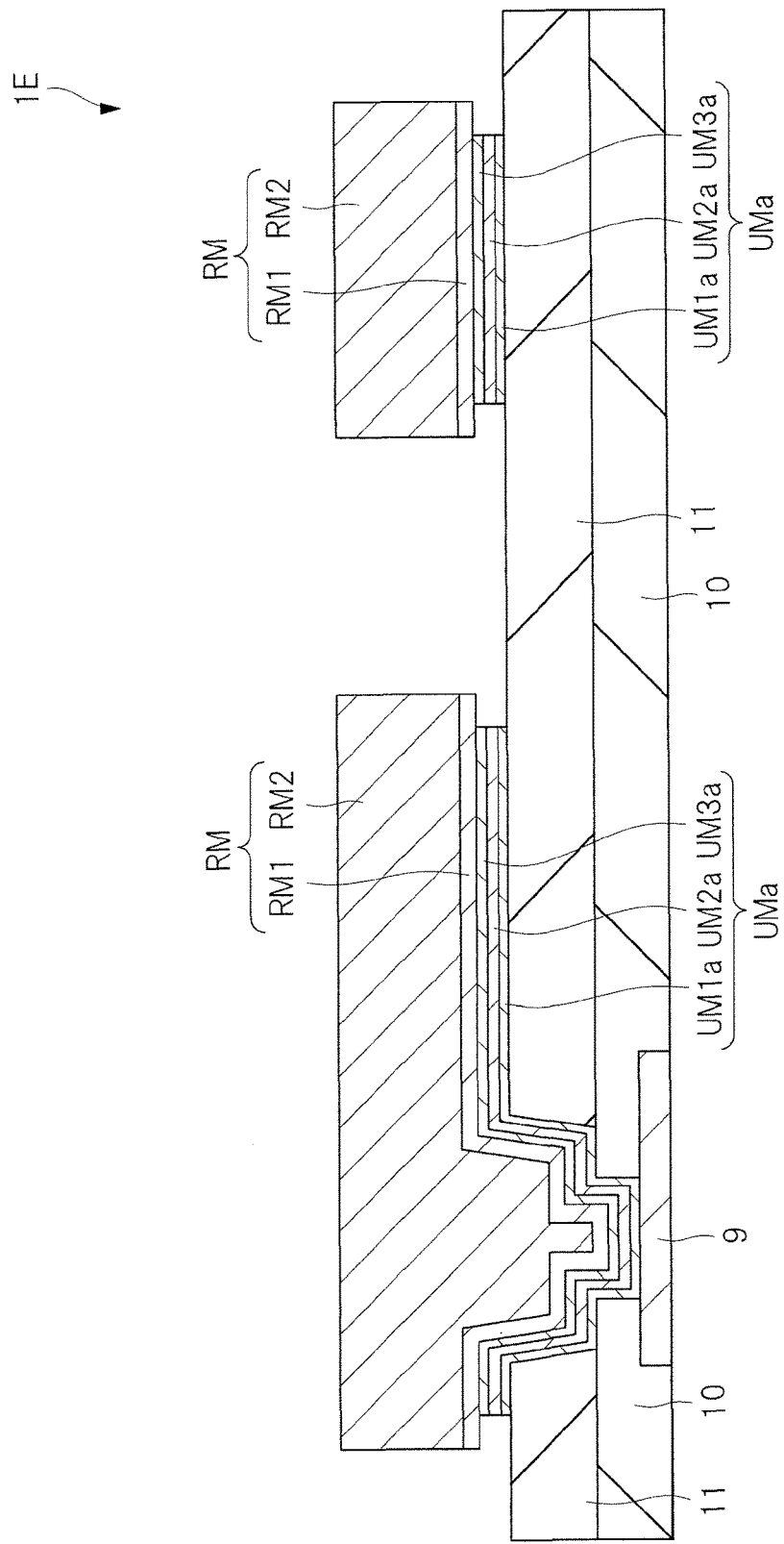
FIG. 20 is a cross-sectional view showing a manufacturing process of a semiconductor device of the second embodiment.
Figure 21:
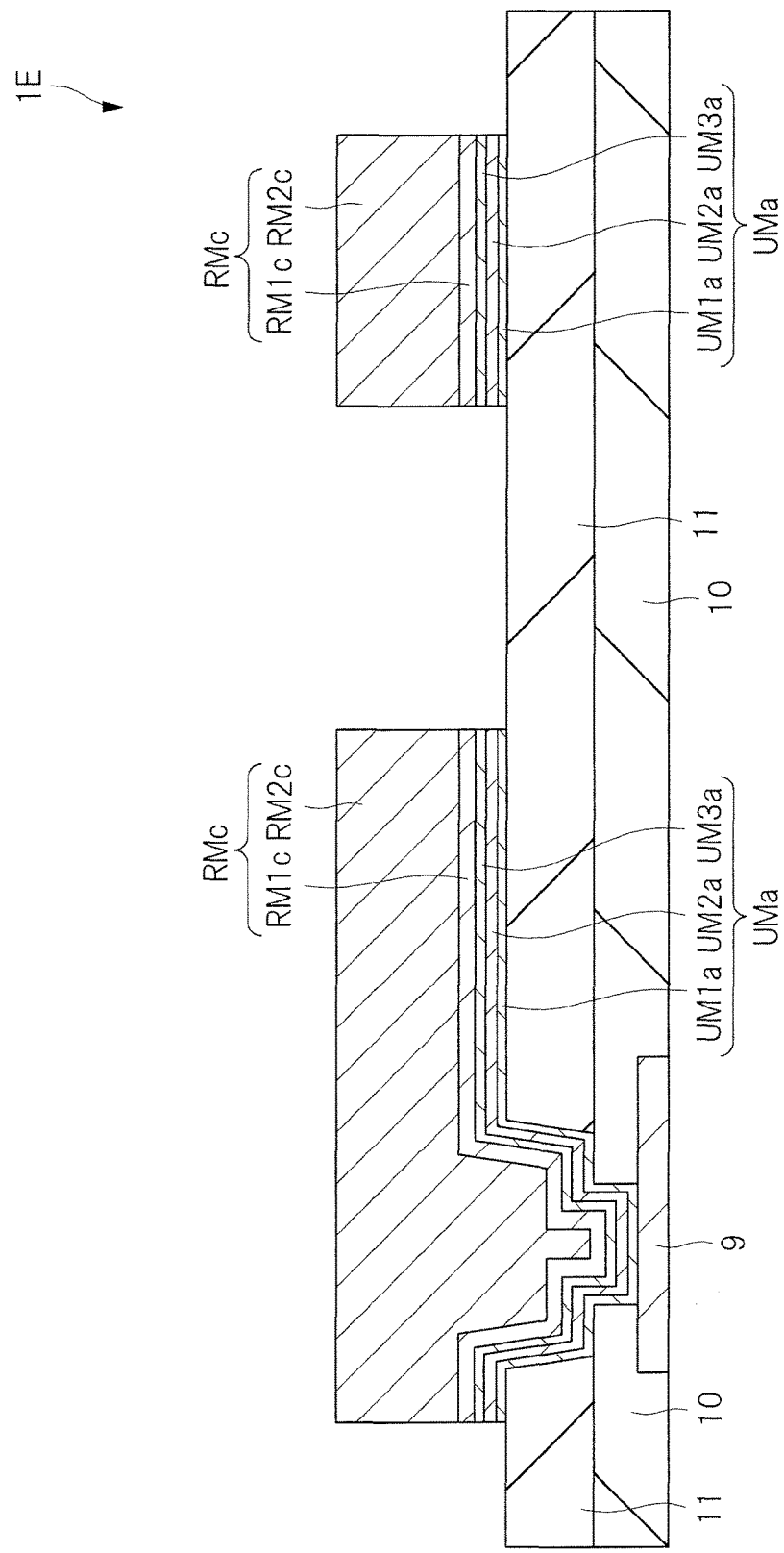
FIG. 21 is a cross-sectional view showing the manufacturing process of the semiconductor device continued from FIG. 20.

FIG. 20 and FIG. 21 are cross-sectional views showing a manufacturing process of a semiconductor device of the second embodiment. In order to distinguish from the semiconductor device of the first embodiment, the semidevice of the second embodiment is represented as a semiconductor chip 1E. The same characters are attached to the parts common to the manufacturing method of the first embodiment.

After the process of removing the seed film RM1 described with reference to FIG. 8 in the first embodiment, the base metal film UM in the region exposed from the seed film RM1 is removed. Unlike the manufacturing method of the first embodiment, since the base metal film UM in the region exposed from the seed film RM1 is completely removed after removing the seed film RM1, the over-etching is indispensable in the etching process of the base metal film UM. Specifically, as shown in FIG. 20, the side etching in which an end of a base metal film UMa recedes from the end of the redistribution line RN occurs, and the structure in which the redistribution line RM overhangs like an eave from the end of the base metal film UMa is formed. Namely, an overhang portion is formed in the redistribution line RM and a space (slit, gap) is created between the redistribution line RM and the base insulating film 11. The redistribution line RM has a laminated structure of the seed film RM1 and the plating film RM2, and the base metal film UMa has a laminated structure of a first base barrier film UM1a, a second base barrier film UM2a and a third base barrier film UM3a.

Next, the redistribution line RM is etched until the side surface of the redistribution line RM is flush with the side surface of the base metal film UMa or until the side surface of the redistribution line RM reaches the inner side of the side surface of the base metal film UMa. Specifically, the overhang portion is removed by the etching. In this manner, as shown in FIG. 21, a redistribution line RMc having the side surface flush with the side surface of the base metal film UMa is formed. The redistribution line RMc has a laminated structure of a seed film RM1c and a plating film RM2c. In addition, it is preferable that the side surface of the redistribution line RMc is present on the inner side of the side surface of the base metal film UMa as described above.

For example, the ammonia aqueous solution is used for the wet etching of the base metal film UM described above. In addition, both of the wet etching and the dry etching can be used for the etching of the redistribution line RM.

After the wet etching described above, the process of forming the cap metal film CM and subsequent processes of the first embodiment are performed to complete the semiconductor device having the semiconductor chip 1E. Since the above-mentioned overhang portion has been removed, it is possible to prevent the peeling of the redistribution line RMc due to the step disconnection of the cap metal film CM. Consequently, since the structure in which the lower surface of the cap metal film CM is in contact with the side surface or the upper surface of the base metal film UM can be achieved, it is possible to prevent the oxidation of the copper film constituting the redistribution line RM and the movement (diffusion) of the copper ions.

Modified Example 5

The modified example 5 corresponds to a modified example of the manufacturing method of the semiconductor device of the second embodiment.

Figure 22:
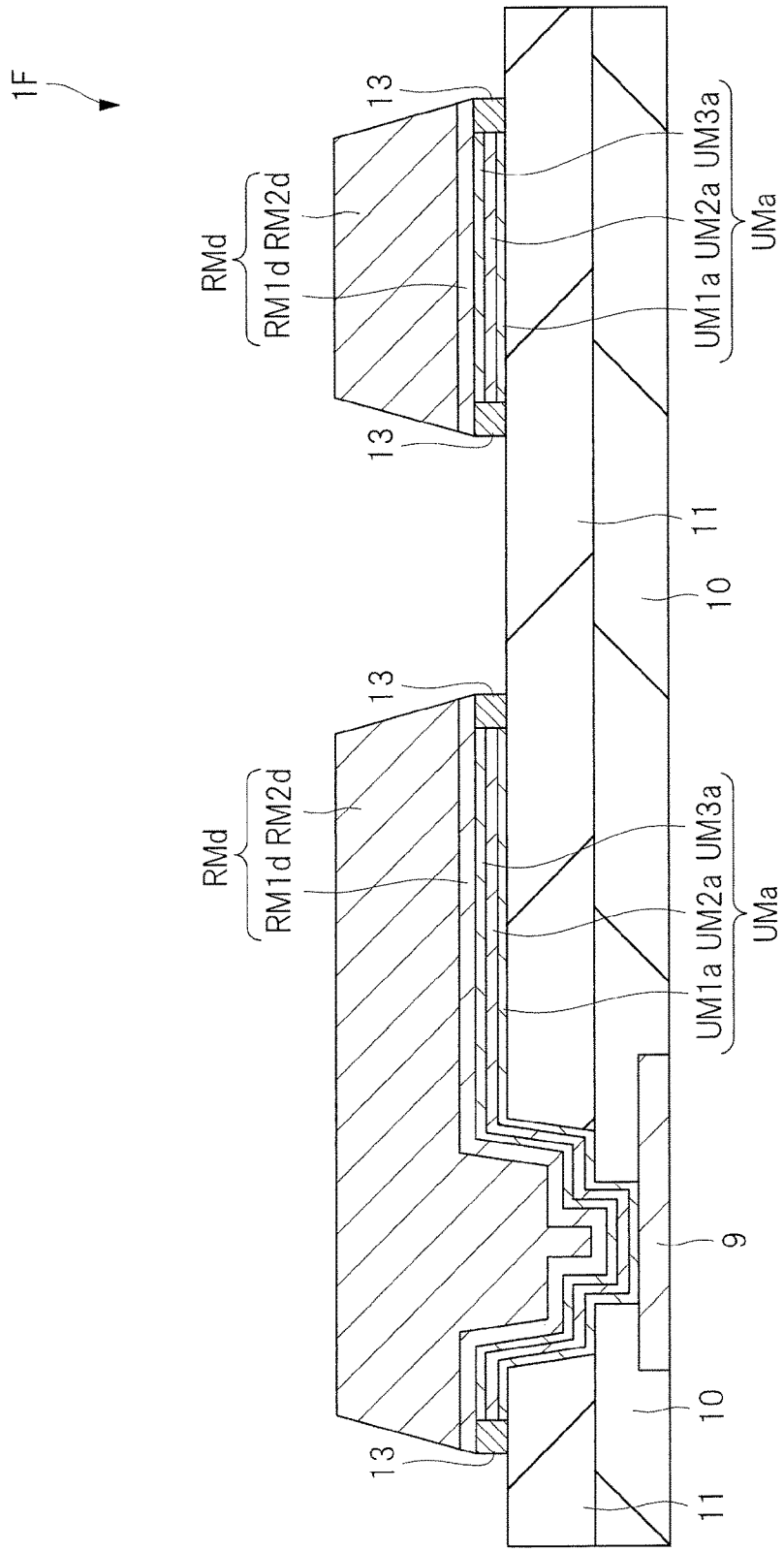
FIG. 22 is a cross-sectional view showing a manufacturing process of a semiconductor device of a modified example 5.

FIG. 22 is a cross-sectional view showing a manufacturing process of a semiconductor device of the modified example 5 of the second embodiment. In order to distinguish from the semiconductor device of the second embodiment, the semiconductor device of the modified example 5 is represented as a semiconductor chip 1F. The same characters are attached to the parts common to the manufacturing method of the first embodiment or the second embodiment.

In the second embodiment, after the etching process of the base metal film UM described with reference to FIG. 20, the sputter etching is performed to the redistribution line RM so as to fill the space below the overhang portion of the redistribution line RM. By performing the argon (Ar) sputter etching to the redistribution line RM shown in FIG. 20, a trapezoidal redistribution line RMd having forward-tapered side surfaces when seen in a cross-sectional view can be obtained as shown in FIG. 22. Furthermore, the space between the overhang portion of the redistribution line RMc and the base insulating film 11 can be filled with redeposited materials (reattached materials) 13 in the process of the argon sputter etching. The redistribution line RMd has a laminated structure of a seed film RM1d and a plating film RM2d.

After the sputter etching described above, the process of forming the cap metal film CM and subsequent processes of the first embodiment are performed to complete the semiconductor device having the semiconductor chip 1F. Since the above-described space has been filled, it is possible to prevent the step disconnection of the cap metal film CM and the peeling of the redistribution line RMd.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, it is also possible to eliminate the space between the overhang portion of the redistribution line RM and the base insulating film 11 by performing the reflow of the modified example 2 instead of removing the overhang portion by etching in the second embodiment. In addition, the mounting process of the modified example 4 may be applied to the semiconductor chip 1E or 1F of the second embodiment or the modified example 5.

Contents other than those described in the embodiments above will be described below.

[Note 1]

A manufacturing method of a semiconductor device, including the steps of:

(a) forming a pad electrode on a main surface of a semiconductor substrate;

(b) forming a first insulating film having an opening on the pad electrode;

(c) forming a base metal film electrically connected to the pad electrode through the opening on the first insulating film;

(d) forming a redistribution line electrically connected to the pad electrode through the base metal film on the base metal film; and (e) forming a cap metal film covering an upper surface and a side surface of the redistribution line, wherein the step (d) includes the steps of:

(d-1) forming the redistribution line electrically connected to the pad electrode through the base metal film on the base metal film;

(d-2) completely etching the base metal film in a region exposed from the redistribution line; and (d-3) then performing wet etching to make the redistribution line recede, and the step (e) includes the steps of:

(e-1) forming a cap barrier film on the entire main surface of the semiconductor substrate; and (e-2) forming the cap metal film by patterning the cap barrier film.

[Note 2]

In the manufacturing method of a semiconductor device described in the note 1 above, the redistribution line is made of a Cu film, and the pad electrode is made of an Al film.

[Note 3]

In the manufacturing method of a semiconductor device described in the note 1 above, a thickness of the redistribution line is larger than a thickness of the pad electrode, and the pad electrode is the thickest among a plurality of wiring layers.

[Note 4]

A semiconductor device including:

a semiconductor substrate;

a plurality of wiring layers formed over the semiconductor substrate;

a pad electrode formed in an uppermost layer of the plurality of wiring layers;

an insulating film having an opening on the pad electrode;

a base metal film formed on the insulating film and having a first lower surface and a first upper surface;

a redistribution line formed on the first upper surface of the base metal film and having a second lower surface, a second upper surface and a side surface; and a cap metal film formed so as to cover the second upper surface and the side surface of the redistribution line and having a third lower surface and a third upper surface, wherein the redistribution line has a first planar pattern, the base metal film and the cap metal film have a second planar pattern larger than the first planar pattern, and the first upper surface of the base metal film and the third lower surface of the cap metal film are in contact with each other in a region outside the redistribution line.

[Note 5]

In the semiconductor device described in the note 4 above, the second planar pattern is larger than the first planar pattern in an entire circumference of the first planar pattern, and the first upper surface of the base metal film and the third lower surface of the cap metal film are in contact with each other in the region outside the redistribution line.

EXPLANATION OF REFERENCE CHARACTERS

CM: cap metal film
CM1, CM2, CM3: cap barrier film
PP: projecting part
PR: resist mask
p1, p2, p3: plug
P1: first planar pattern
P2: second planar pattern
Qn: n channel MIS transistor
Qp: p channel MIS transistor
RM, RMa, RMb, RMc, RMd, RMS, RMV: redistribution line
RM1: seed film
RM2: plating film
UM: base metal film
UMa, UM1, UM2, UM3: base barrier film
1A, 1B, 1C, 1D, 1E, 1F: semiconductor chip
1P: semiconductor substrate
2P: p type well
2N: n type well
3: element isolation trench
3a: element isolation insulating film
4, 6, 8: interlayer insulating film
5, 7, 9: Al wiring
9a: pad electrode
10: surface protection film
10a: pad opening
11: base insulating film
11a: opening
12: protection film
13: redeposited material
18: external pad electrode
25D: die pad part
25L: lead
26, 38: sealing member
27, 37: wire
30: wiring board
31: core layer
32: bonding finger
33: land
34: internal-via wiring
35: solder resist
36: bump electrode
39: adhesive layer

What is claimed is:

1. A semiconductor device comprising:
   a semiconductor substrate:
   a plurality of wiring layers formed over the semiconductor substrate;
   a pad electrode formed in an uppermost layer of the plurality of wiring layers;
   an insulating film having an opening on the pad electrode;
   a base metal film formed on the insulating film;
   a redistribution line formed over the base metal film; and
   a cap metal film covering an upper surface and a side surface of the redistribution line,
   the redistribution line and the base metal film are made of different materials from each other,
   the redistribution line and the cap metal film are made of different materials from each other,
   wherein the base metal film and the cap metal film have a projecting portion disposed outside of the cap metal film covering the side surface of the redistribution line, and
   wherein the base metal film and the cap metal film are in contact with each other in the projecting portion.

2. The semiconductor device according to claim 1, wherein a sum of a thickness of the base metal film and a thickness of the cap metal film present in the region outside the redistribution line is greater than a thickness of the base metal film below the redistribution line.

3. The semiconductor device according to claim 1, wherein the cap metal film is made up of a laminated film including a first cap barrier film and a second cap barrier film formed on the first cap barrier film,
   the first cap barrier film is a first Ti film,
   the second cap barrier film is a Pd film,
   the base metal film is a laminated film including a TiN film and a second Ti film formed on the TiN film, and
   the first Ti film is in contact with the second Ti film in the region outside the redistribution line.

4. The semiconductor device according to claim 1, wherein the redistribution line contains Cu as a main component,
   the pad electrode contains Al as a main component, and a thickness of the redistribution line is greater than a thickness of the pad electrode.

5. The semiconductor device according to claim 3, wherein a copper wire is provided on the second cap metal film formed over the redistribution line.

6. A manufacturing method of a semiconductor device comprising the steps of:
   (a) preparing a semiconductor substrate having a plurality of wiring layers and a pad electrode formed in an uppermost layer of the plurality of wiring layers;
   (b) forming a first insulating film having a first opening on the pad electrode;
   (c) forming a base metal film electrically connected to the pad electrode through the first opening on the first insulating film;
   (d) forming a redistribution line electrically connected to the pad electrode through the base metal film on the base metal film; and
   (e) forming a cap metal film covering an upper surface and a side surface of the redistribution line,
   wherein the step (e) includes the steps of:
   (e-1) forming a cap metal material film over a main surface of the semiconductor substrate; and
   (e-2) etching the cap metal material film over the first insulating film, thereby forming the cap metal film,
   the etching in the step (e-2) is performed in a state where a part of the base metal film is present in a region outside the redistribution line, and
   after the step (e-2), the base metal film and the cap metal film have a projecting portion disposed outside of the cap metal film formed on the side surface of the redistribution line, and
   wherein the base metal film and the cap metal film are in contact with each other in the projecting portion.

7. The manufacturing method of a semiconductor device according to claim 6,
   wherein the redistribution line and the base metal film are made of different materials, and
   the redistribution line and the cap metal film are made of different materials.

8. The manufacturing method of a semiconductor device according to claim 6,
   wherein the cap metal material film is made up of a laminated film including a first cap barrier film, a second cap barrier film and a third cap barrier film, and
   the base metal film and the third cap barrier film contain the same material.

9. The manufacturing method of a semiconductor device according to claim 6,
   wherein the step (d) includes the steps of:
   (d-1) forming a seed film on the base metal film;
   (d-2) forming a resist pattern exposing a part of the seed film on the seed film;
   (d-3) forming the redistribution line by electroplating on the seed film exposed from the resist pattern;
   (d-4) removing the resist pattern; and
   (d-5) removing the seed film in the region outside the redistribution line, and
   in the step (e), the cap metal film is formed so as to cover a side surface of the seed film.

10. The manufacturing method of a semiconductor device according to claim 6,
    wherein the step (e-2) includes a step of performing wet etching of the base metal film.

11. The manufacturing method of a semiconductor device according to claim 6,
    wherein the redistribution line contains Cu as a main component,
    the pad electrode contains Al as a main component, and
    a thickness of the redistribution line is greater than a thickness of the pad electrode.

12. The manufacturing method of a semiconductor device according to claim 6,
    wherein a second insulating film is formed between the first insulating film and the pad electrode, and
    the second insulating film has a second opening smaller than the first opening in the first insulating film.

13. The manufacturing method of a semiconductor device according to claim 6, further comprising the step of:
    after the step (e), forming a third insulating film having a third opening on the cap metal film,
    wherein each of the first insulating film and the third insulating film includes a polyimide film.

14. The manufacturing method of a semiconductor device according to claim 6,
    wherein a copper wire is connected to the cap metal film on the redistribution line.

15. The manufacturing method of a semiconductor device according to claim 6, further comprising the step of:
    after the step (d) and before the step (e), etching a part of the base metal film.

* * * * *